(12) United States Patent
Satoh

(10) Patent No.: US 6,995,623 B2
(45) Date of Patent: Feb. 7, 2006

(54) PIEZOELECTRIC OSCILLATOR

(75) Inventor: Tomio Satoh, Kouza-gun (JP)

(73) Assignee: Toyo Communication Equipment Co., Ltd., Kanagawa (JP)

(*) Notice: Subject to any disclaimer, the term of this patent is extended or adjusted under 35 U.S.C. 154(b) by 86 days.

(21) Appl. No.: 10/486,753

(22) PCT Filed: Aug. 15, 2002

(86) PCT No.: PCT/JP02/08297

§ 371 (c)(1),
(2), (4) Date: Feb. 13, 2004

(87) PCT Pub. No.: WO03/017461

PCT Pub. Date: Feb. 27, 2003

(65) Prior Publication Data

US 2004/0183608 A1  Sep. 23, 2004

(30) Foreign Application Priority Data

Aug. 16, 2001 (JP) ............................. 2001-246859
Nov. 7, 2001 (JP) ............................. 2001-341326

(51) Int. Cl.
*H03B 5/30* (2006.01)

(52) U.S. Cl. ........................... 331/116 R; 331/116 FE; 331/175; 331/158

(58) Field of Classification Search ............... 331/175, 331/116 R, 116 FE, 158
See application file for complete search history.

(56) References Cited

U.S. PATENT DOCUMENTS 5,789,990 A * 8/1998 Ash et al. ............... 331/107 A
6,150,894 A * 11/2000 Seng et al. ................. 331/175

FOREIGN PATENT DOCUMENTS

| JP | 9-232867 | 9/1997 |
| JP | 11-330855 | 11/1999 |
| JP | 2001-177346 | 6/2001 |

* cited by examiner

*Primary Examiner*—Arnold Kinkead
(74) *Attorney, Agent, or Firm*—Koda & Androlia

(57) ABSTRACT

The present invention has for its object to provide a piezoelectric oscillator that has improved secular variation characteristics and excels in suppressing undesired resonance. The piezoelectric oscillator has a piezoelectric vibrator and an oscillation transistor, and since a collector load resistance, a capacitance, a parallel circuit of a resistance and a capacitance, and said piezoelectric vibrator are connected between the collector of the transistor and an AC-wise grounded power supply, between the emitter and collector of the transistor, between the emitter of the transistor and the ground, and between the base of the transistor and the ground, respectively, it is possible to sharply reduce a current flow through the crystal vibrator, permitting suppression of frequency variations by the secular change characteristics of the oscillator; furthermore, the reduction of the current flow through the piezoelectric vibrator improves C/N and prevents undesired vibration and oscillation as well as decreases secular changes.

17 Claims, 26 Drawing Sheets

US 6,995,623 B2

PIEZOELECTRIC OSCILLATOR

TECHNICAL FIELD

The present invention relates to a piezoelectric oscillator and, more particularly, to a piezoelectric oscillator that has improved secular change characteristics and excels in suppressing an undesired resonance through reduction of the current flow through a piezoelectric vibrator.

BACKGROUND ART

Piezoelectric oscillators, typified by crystal oscillators, are used heavily as frequency signal sources for communication equipment or the like because of their high frequency stability. With the continued miniaturization of communication equipment, there is a growing demand for higher frequency stability which depends on the suppression of secular variations and undesired resonances. The piezoelectric vibrator through utilization of a piezoelectric phenomenon accompanying mechanical vibrations; it is customary in the art to keep on its oscillation by supplying a current of a predetermined value or more to the piezoelectric vibrator to generate therein mechanical vibrations at levels above a certain value. It is known that the mechanical vibrations of the vibrator induce therein mechanical stress and that the long-term creation of a great mechanical distortion causes secular changes of the resonance frequency, degradation of electric resistances, deterioration of resonance characteristics under the influence of mechanical fatigue and so forth. In particular, as an oscillator required to maintain an extremely high degree of frequency stability, there is now used an oven type oscillator (OCXO) housed in a constant temperature oven so as to minimize frequency changes caused by temperature variations; such an oscillator adopts means for improving the secular variation characteristic and the undesired resonance suppression characteristic (an undesired mode oscillation suppression characteristic) by minimizing the current flow through the vibrator to restrain the induction of stress by driving.

FIG. 23 shows an example of an oscillation circuit heretofore used in OCXO.

A crystal oscillator 100 depicted in FIG. 23 is adapted to: apply the output from an oscillation circuit 101 surrounded by the broken line to an AGC circuit 104 via a capacitance 102 and a buffer circuit 103; rectify one portion of the oscillation output in the AGC circuit to generate a DC voltage; and provide the DC voltage as a base bias voltage of an oscillation transistor of the oscillation circuit 101, thereby holding the base terminal current of the oscillation transistor at a certain level. Incidentally, such a circuit is called an AGC circuit in the conventional OCXO, but in the present invention attention is rather paid to the function of a circuit which cuts down the current flow through the crystal vibrator, and hence the circuit will hereinafter be referred to as a current suppressing circuit.

In this example, the oscillation circuit 101 is a common Colpitts type oscillation circuit, in which a crystal vibrator 106 grounded at one end via a capacitance 105 is connected at the other end to the base of a transistor 107, a series circuit of capacitances 108 and 109 is connected between the base of a transistor 107 and the ground, and the connection point of the series circuit is connected to the emitter of the transistor 107 and grounded via a resistance 111.

A bias circuit for the base of the transistor 107 is formed by a resistance 110 connected between the base and the ground, and a resistance 112 for the voltage supply therethrough from the current suppressing circuit (the AGC circuit) 104 described later on. The output from the oscillator is derived via a collector load resistance 113 connected between the collector of the transistor and an AC-wise grounded power supply line Vcc and is provided via the capacitance 102 and the buffer circuit 103 as mentioned above, and one portion of the oscillator output provided to an output terminal OUT via a resistance 123 and a capacitance 124.

On the other hand, the current suppressing circuit 104 branches one portion of the output signal from the buffer circuit 103 via a series circuit of a resistance 114 and a capacitance 115, and a branched current is provided to the cathode end of a diode 116 and the anode end of a diode 117. The other ends of these diodes are individually grounded via capacitances 118 and 119, respectively, and the other ends of the diodes are interconnected via a resistance 120, and the anode end of the diode 116 is connected to the base of the transistor 107 via the resistance 112 of the oscillation circuit 101. Further, a series circuit of resistances 121 and 122 is connected between the power supply Vcc and the ground, the connection midpoint of the series circuit being connected to the cathode of the diode 117.

A description will be given below of the operation of the crystal oscillator 100 of the above configuration. Since the oscillation circuit 101 is a common Colpitts type one, the following description will not be made of its operation but given mainly of the operation of the current suppressing circuit 104.

In the first place, upon application of the oscillation output from the oscillation circuit 101 via the buffer 103 to the current suppressing circuit 104, the positive and negative half cycles of the oscillation output flow to the ground via the diode 117 and the diode 116, respectively. As the result, the voltage of the connected position between the resistance 120 and diode 116 becomes low corresponding to the oscillation output level, and the voltage of the connected position between the resistance 120 and diode 117 becomes high corresponding to the oscillation output level. That is, a voltage drop across the resistance 120 increases with an increase in the oscillation output level.

On the other hand, the base bias voltage for the oscillation transistor 107 is supplied from Vcc via a the resistance 121, the resistance 120 and the resistance 112; in this instance, since the voltage drop across the resistance 120 increases with an increase in the oscillation level, the base bias voltage drops, and consequently, the base terminal current of the transistor decreases, resulting in a decrease in the oscillation gain and a reduction in the current flow through the vibrator accordingly. That is, an increase in the current flow through the crystal vibrator 106 causes an increase in the oscillation output to be fed to the current suppressing circuit 104, producing a corresponding increase in the voltage drop across the resistance 120 and hence causing a decrease in the base terminal current of the transistor 107.

Conversely, when the oscillation output decreases, the base voltage increases corresponding to a decrease in the voltage drop across the resistance 120—this increases the gain of the transistor 107 and the oscillation output, maintaining the base current at a certain level determined by respective circuit constants. Because of its complicated configuration, the circuit of this example is used only in relatively expensive OCXOs, and is rarely used in common oscillators. On the other hand, there has been proposed such an oscillation circuit as depicted in FIG. 24 which is simple-structured but permits reduction in the current flow through the crystal vibrator. In this circuit denoted generally by 200, a parallel tuning circuit composed of a capacitance $C_c$ and an inductance $L_c$ is connected between the collector of an oscillation transistor TR1 and the power supply line Vcc AC-wise grounded via a capacitance Cv; a capacitance $c_3$ is connected between the collector and emitter of the transistor; a parallel circuit of a capacitance $C_e$ and a resistance $R_e$ is connected between the emitter of the transistor and the ground; and a crystal vibrator X is connected between the base of the transistor and the ground. An appropriate base bias voltage is applied by resistances Rb1 and Rb2. Incidentally, the oscillation output is derived via a secondary inductance of the above-mentioned inductance $L_c$. This circuit can be expressed equivalently as shown in FIGS. 25 and 26.

FIG. 25 shows an equivalent circuit of the crystal oscillator 200 of FIG. 24, in which $z_1$ denotes a base-emitter interterminal impedance composed of a parallel circuit of a junction capacitance $C_\pi$ between the base and emitter of the transistor TR1 and an input resistance $R_\pi$ of the transistor TR1, $z_2$ denotes an impedance composed of a parallel circuit of the resistance $R_e$ and the capacitance $C_e$ between the emitter of the transistor TR1 and the ground, and $g_m$ denotes the mutual inductance of the transistor.

FIG. 26 shows an equivalent circuit of the crystal oscillator 200 in which the impedance $z_1$ in FIG. 25 is replaced with a series circuit of a capacitance $c_1$ component and a resistance $r_1$, the impedance $z_2$ in FIG. 26 is replaced with a capacitance $c_2$ component and a resistance $r_2$ component, and the parallel circuit of the capacitance $C_c$ and the inductance $L_c$ is converted to a capacitance component $c_4$ (where $c_4 = C_c - 1/(\omega^2 L_c)$).

In FIG. 26 the input impedance $Z_{IN}$ of the transistor TR1 is $Z_{IN} = R_{IN} + jX_{IN}$, and it can be expressed by the following equation by use of the circuit parameters shown in FIG. 26.

$$Z_{IN} = R_{IN} + jX_{IN}$$

$$R_{IN} = r_1 + \frac{g_m}{\left(\frac{c_3}{c_\alpha}\right)^2 + (\omega c_3 r_2)^2}\left\{\frac{c_3}{c_\alpha}\left(r_1 r_2 - \frac{1}{\omega^2 c_1 c_2}\right) - c_3 r_2\left(\frac{r_1}{c_2} + \frac{r_2}{c_1}\right)\right\}$$

$$X_{IN} = -\frac{1}{\omega c_1} - \frac{g_m}{\left(\frac{c_3}{c_\alpha}\right)^2 + (\omega c_3 r_2)^2}\left\{\omega c_3 r_2\left(r_1 r_2 - \frac{1}{\omega^2 c_1 c_2}\right) + \frac{c_3}{\omega c_\alpha}\left(\frac{r_1}{c_2} + \frac{r_2}{c_1}\right)\right\}$$

$$\frac{1}{c_\alpha} = \frac{1}{c_2} + \frac{1}{c_3} + \frac{1}{c_4}, \; c_4 = C_c - \frac{1}{\omega^2 L_c} \; r_1 = \frac{R_\pi}{1 + (\omega C_\pi R_\pi)^2},$$

$$c_1 = \frac{1}{\omega^2 C_\pi R_\pi r_1}, \; r_2 = \frac{R_e}{1 + (\omega C_e R_e)^2}, \; c_2 = \frac{1}{\omega^2 C_e R_e r_1}$$

FIG. 27 shows frequency characteristics of the negative resistance and reactance of an oscillation amplifying circuit portion of the crystal oscillator 200 of FIG. 24 which were obtained by simulations based on the above equation.

As shown in FIG. 27, since the frequency band in which to provide a sufficient value of negative resistance is as narrow as 9 MHz to 10 MHz, and since in this frequency band the reactance component abruptly changes from a capacitive to inductive one, it is difficult for the crystal oscillator 200 to keep on with stable oscillation; furthermore, the inductance connected to the collector of the oscillation transistor causes instability in its oscillation, readily leading to the occurrence of abnormal oscillation.

Accordingly, the oscillation circuit of such a configuration is altogether impracticable except for experimental use alone. As a mater of fact, it is only the AGC circuit in OCXO of FIG. 23 that can be put to practical use.

In the case of such a piezoelectric oscillation circuit 100 as described above, however, since the AGC circuit is complex in configuration and uses many parts, the crystal oscillator inevitably becomes bulky and there are limits on the reduction of the consumption of current and on the reduction of the current flow through the crystal vibrator. That is, though complex in circuit configuration, the above-described conventional AGC circuit type crystal vibrator current reducing means is applicable to the expensive oven type crystal oscillator (OCXO), but it cannot ever be applied to oscillators for ordinary portable telephones and radio equipment because the use of such means entails increased geometry of the device, a steep rise in manufacturing costs, increased consumption of current, and so forth.

The present invention is directed to the solution of the above-mentioned problems of the piezoelectric oscillation circuit, and has for its object to provide a piezoelectric oscillator which achieves improved secular change characteristics and effective suppression of undesired resonance through reduction of the excitation level of the crystal oscillator by use of a simple circuit configuration.

DISCLOSURE OF THE INVENTION

To attain the above objective, the present invention is a piezoelectric oscillator comprising a piezoelectric vibrator functioning as a resonance inductance and an oscillation transistor, characterized in that: only a collector load resistance is connected between the collector of said transistor and an AC-wise grounded power supply; a first capacitance is connected between the emitter and collector of said transistor, a parallel circuit of a resistance and a second capacitance is connected between the emitter of said transistor and the ground, and at least said piezoelectric vibrator is connected between the base of said transistor and the ground; and said first capacitance has a value 0.1 times larger than that of said second capacitance.

The present invention is a piezoelectric oscillator comprising a piezoelectric vibrator functioning as a resonance inductance and an oscillation transistor, characterized in that: a collector load resistance is connected between the collector of said transistor and an AC-wise grounded power supply, a first capacitance is connected between the emitter and collector of said transistor, a parallel circuit of a resistance and a second capacitance is connected between the emitter of said transistor and the ground, and at least said piezoelectric vibrator is connected between the base of said transistor and the ground, respectively; and said first capacitance has a value larger than that of said second capacitance.

The present invention is a piezoelectric oscillator comprising a piezoelectric vibrator functioning as a resonance inductance and an oscillation transistor, characterized in that: a collector load resistance is connected between the collector of said transistor and an AC-wise grounded power supply, a first capacitance is connected between the emitter and collector of said transistor, a parallel circuit of a resistance and a second capacitance is connected between the emitter of said transistor and the ground, and at least said piezoelectric vibrator is connected between the base of said transistor and the ground, respectively; and said first capacitance has a value in the range of larger than 1 to smaller than 3 times the value of said second capacitance.

The present invention is a piezoelectric oscillator comprising a piezoelectric vibrator functioning as a resonance inductance, an oscillation transistor, and buffer transistor, characterized in that: the collector of said oscillation transistor and the emitter of said buffer transistor are cascade-connected in the forward direction; an appropriate bias voltage is applied to the each base of said transistors; the base of said buffer transistor is grounded AC-wise via a bypass capacitance; only a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance; at least said piezoelectric vibrator is connected between the base of said transistor and the ground; and said first capacitance has a value 0.1 times larger than that of said second capacitance.

The present invention is a piezoelectric oscillator comprising a piezoelectric vibrator functioning as a resonance inductance, an oscillation transistor, and buffer transistor, characterized in that: the collector of said oscillation transistor and the emitter of said buffer transistor are cascade-connected in the forward direction; an appropriate bias voltage is applied to the each base of said transistors; the base of said buffer transistor is grounded AC-wise via a bypass capacitance; a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance; at least said piezoelectric vibrator is connected between the base of said transistor and the ground; and said first capacitance has a value larger than that of said second capacitance.

The present invention is a piezoelectric oscillator comprising a piezoelectric vibrator functioning as a resonance inductance, an oscillation transistor, and buffer transistor, characterized in that: the collector of said oscillation transistor and the emitter of said buffer transistor are cascade-connected in the forward direction; an appropriate bias voltage is applied to the each base of said transistors; the base of said buffer transistor is grounded AC-wise via a bypass capacitance; a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance; at least said piezoelectric vibrator is connected between the base of said transistor and the ground; and said first capacitance has a value in the range of larger than 1 to smaller than 3 times the value of said second capacitance.

The present invention is a piezoelectric oscillator comprising a piezoelectric vibrator functioning as a resonance inductance and an oscillation transistor, characterized in that: only a collector load resistance is connected between the collector of said transistor and an AC-wise grounded power supply; a first capacitance is connected between the emitter and collector of said transistor, a parallel circuit of a resistance and a second capacitance is connected between the emitter of said transistor and the ground, and at least said piezoelectric vibrator is connected between the base of said transistor and the ground, respectively; a series circuit of two resistances is connected between the collector and base of said oscillation transistor, the connection point of said two resistances being grounded AC-wise via a bypass capacitance; and said first capacitance has a value 0.1 times larger than that of said second capacitance.

The present invention is a piezoelectric oscillator comprising a piezoelectric vibrator functioning as a resonance inductance and an oscillation transistor, characterized in that: a collector load resistance is connected between the collector of said transistor and an AC-wise grounded power supply, a first capacitance is connected between the emitter and collector of said transistor, a parallel circuit of a resistance and a second capacitance is connected between the emitter of said transistor and the ground, and at least said piezoelectric vibrator is connected between the base of said transistor and the ground, respectively; and said first capacitance has a value larger than that of said second capacitance.

The present invention is a piezoelectric oscillator comprising a piezoelectric vibrator functioning as a resonance inductance and an oscillation transistor, characterized in that: a collector load resistance is connected between the collector of said transistor and an AC-wise ground power supply, a first capacitance is connected between the emitter and collector of said transistor, a parallel circuit of a resistance and a second capacitance is connected between the emitter of said transistor and the ground, and at least said piezoelectric vibrator is connected between the base of said transistor and the ground, respectively; a series circuit of two resistances is connected between the collector and base of said oscillation transistor, the connection point of said two resistances being grounded AC-wise via a bypass capacitance; and said first capacitance has a value in the range of larger than 1 to smaller than 3 times the value of said second capacitance.

The present invention is a piezoelectric oscillator comprising a piezoelectric vibrator functioning as a resonance inductance, an oscillation transistor, and buffer transistor, characterized in that: the collector of said oscillation transistor and the emitter of said buffer transistor are cascade-connected in the forward direction; an appropriate bias voltage is applied to the each base of said transistors; the base of said buffer transistor is grounded AC-wise via a bypass capacitance; only a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance and a parallel circuit of a third capacitance and an inductance; at least said piezoelectric vibrator is connected between the base of said transistor and the ground; and said first capacitance has a value 0.1 times larger than that of said second capacitance.

The present invention is a piezoelectric oscillator comprising a piezoelectric vibrator functioning as a resonance inductance, an oscillation transistor, and buffer transistor, characterized in that: the collector of said oscillation transistor and the emitter of said buffer transistor are cascade-connected in the forward direction; an appropriate bias voltage is applied to the each base of said transistors; the base of said buffer transistor is grounded AC-wise via a bypass capacitance; a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance and a parallel circuit of a third capacitance and an inductance; at least said piezoelectric vibrator is connected between the base of said transistor and the ground; and said first capacitance has a value larger than that of said second capacitance.

The present invention is a piezoelectric oscillator comprising a piezoelectric vibrator functioning as a resonance inductance, an oscillation transistor, and buffer transistor, characterized in that: the collector of said oscillation transistor and the emitter of said buffer transistor are cascade-connected in the forward direction; an appropriate bias voltage is applied to the each base of said transistors; the base of said buffer transistor is grounded AC-wise via a bypass capacitance; a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance and a parallel circuit of a third capacitance and an inductance; at least said piezoelectric vibrator is connected between the base of said transistor and the ground; and said first capacitance has a value in the range of larger than 1 to smaller than 3 times the value of said second capacitance.

The present invention is a piezoelectric oscillator comprising a piezoelectric vibrator functioning as a resonance inductance and an oscillation transistor, characterized in that: only a collector load resistance is connected between the collector of said transistor and an AC-wise grounded power supply; a first capacitance is connected between the emitter and collector of said transistor, and at least said piezoelectric vibrator is connected between the base of said transistor and the ground, respectively; the emitter of said oscillation transistor is grounded via a parallel circuit of a resistance and a second capacitance and a parallel circuit of a third capacitance and an inductance; and said first capacitance has a value 0.1 times larger than that of said second capacitance.

The present invention is a piezoelectric oscillator comprising a piezoelectric vibrator functioning as a resonance inductance and an oscillation transistor, characterized in that: a collector load resistance is connected between the collector of said transistor and an AC-wise grounded power supply, a first capacitance is connected between the emitter and collector of said transistor, and at least said piezoelectric vibrator is connected between the base of said transistor and the ground, respectively; the emitter of said oscillation transistor is grounded via a parallel circuit of a resistance and a second capacitance and a parallel circuit of a third capacitance and an inductance; and said first capacitance has a value larger than that of said second capacitance.

The present invention is a piezoelectric oscillator comprising a piezoelectric vibrator functioning as a resonance inductance and an oscillation transistor, characterized in that: a collector load resistance is connected between the collector of said transistor and an AC-wise grounded power supply, a first capacitance is connected between the emitter and collector of said transistor, and at least said piezoelectric vibrator is connected between the base of said transistor and the ground, respectively; the emitter of said oscillation transistor is grounded via a parallel circuit of a resistance and a second capacitance and a parallel circuit of a third capacitance and an inductance; and said first capacitance has a value in the range of larger than 1 to smaller than 3 times the value of said second capacitance.

The present invention is a piezoelectric oscillator comprising a piezoelectric vibrator functioning as a resonance inductance, an oscillation transistor, and buffer transistor, characterized in that: the collector of said oscillation transistor and the emitter of said buffer transistor are cascade-connected in the forward direction; an appropriate bias voltage is applied to the each base of said transistors; the base of said buffer transistor is grounded AC-wise via a bypass capacitance; a collector load resistance is connected between the collector of said buffer transistor and an AC-wise grounded power supply; a circuit having a DC cut-off capacitance connected in series to a parallel circuit of a first capacitance and an inductance is connected between the collector of said buffer transistor and the emitter of said oscillation transistor; the emitter of said oscillation transistor is grounded via a parallel circuit of a resistance and a second capacitance; and at least said piezoelectric vibrator is connected between the base of said transistor and the ground.

The present invention is a piezoelectric oscillator comprising a piezoelectric vibrator functioning as a resonance inductance and an oscillation transistor, characterized in that: a collector load resistance is connected between the collector of said transistor and an AC-wise grounded power supply, a capacitance is connected between the emitter and collector of said transistor, a parallel circuit of a resistance and a capacitance is connected between the emitter of said transistor and the ground, and at least said piezoelectric vibrator is connected between the base of said transistor and the ground, respectively; and a circuit having a DC cut-off capacitance connected in series to a parallel circuit of a capacitance and an inductance is connected.

BEST MODE FOR CARRYING OUT THE INVENTION

Figure 1:
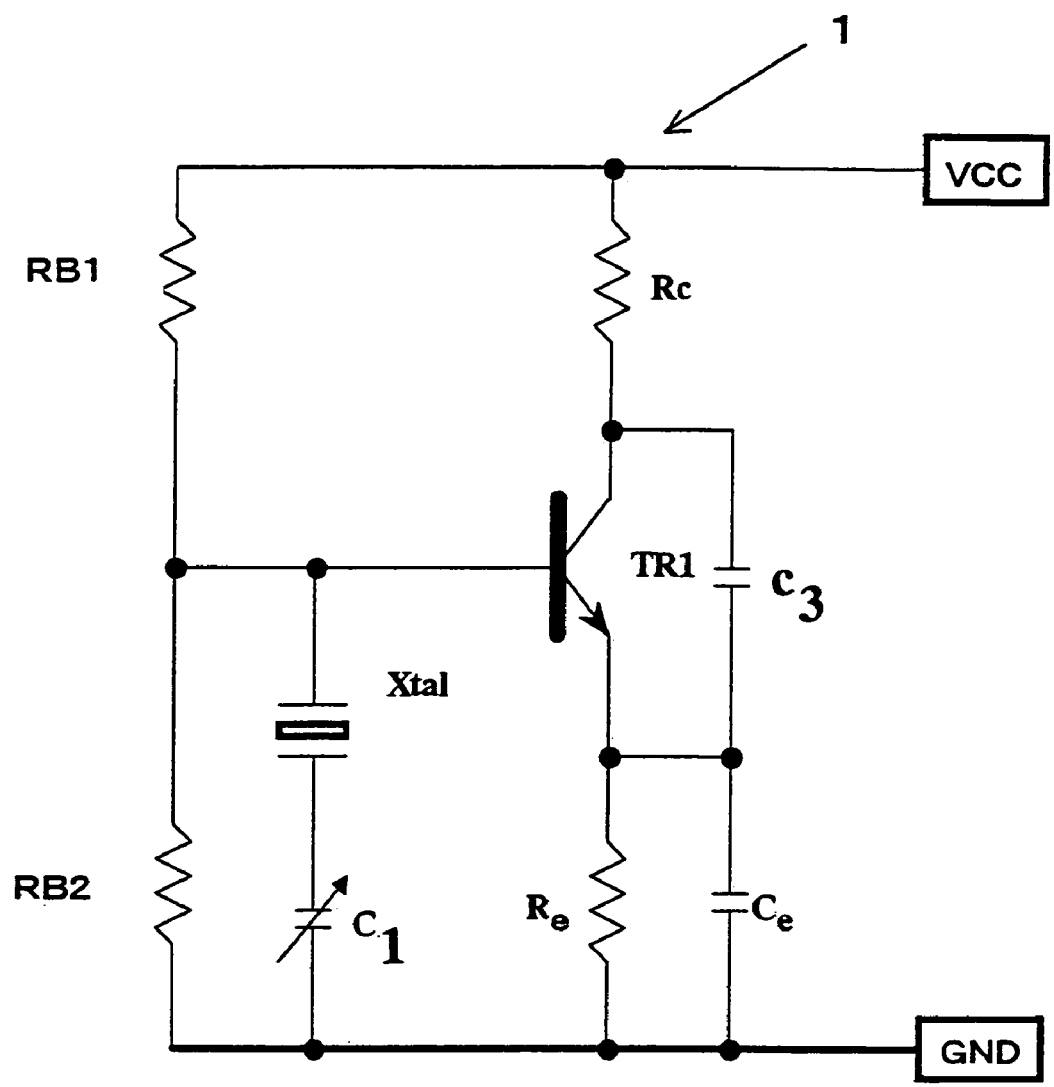
FIG. 1 is circuit diagram of a crystal oscillator according to a first embodiment of the present invention.

The present invention will hereinafter be described in detail with reference to the mode of its working shown in the drawings.

FIG. 1 is a circuit diagram of an embodiment of the piezoelectric oscillator according to the present invention.

In the illustrated piezoelectric oscillator 1, a series circuit of a crystal vibrator X and a capacitance $c_1$ is connected between the base of an oscillation transistor TR1 and the ground, a capacitance $c_3$ is connected between the collector and emitter of the transistor TR1, a parallel circuit of a capacitance $C_e$ and a resistance $R_e$ is connected between the emitter of the transistor and the ground, and a collector load resistance $R_c$ is connected between the collector of the transistor and the power supply Vcc; a proper bias voltage is applied to the base of the transistor by resistances Rb1 and Rb2.

Figure 24:
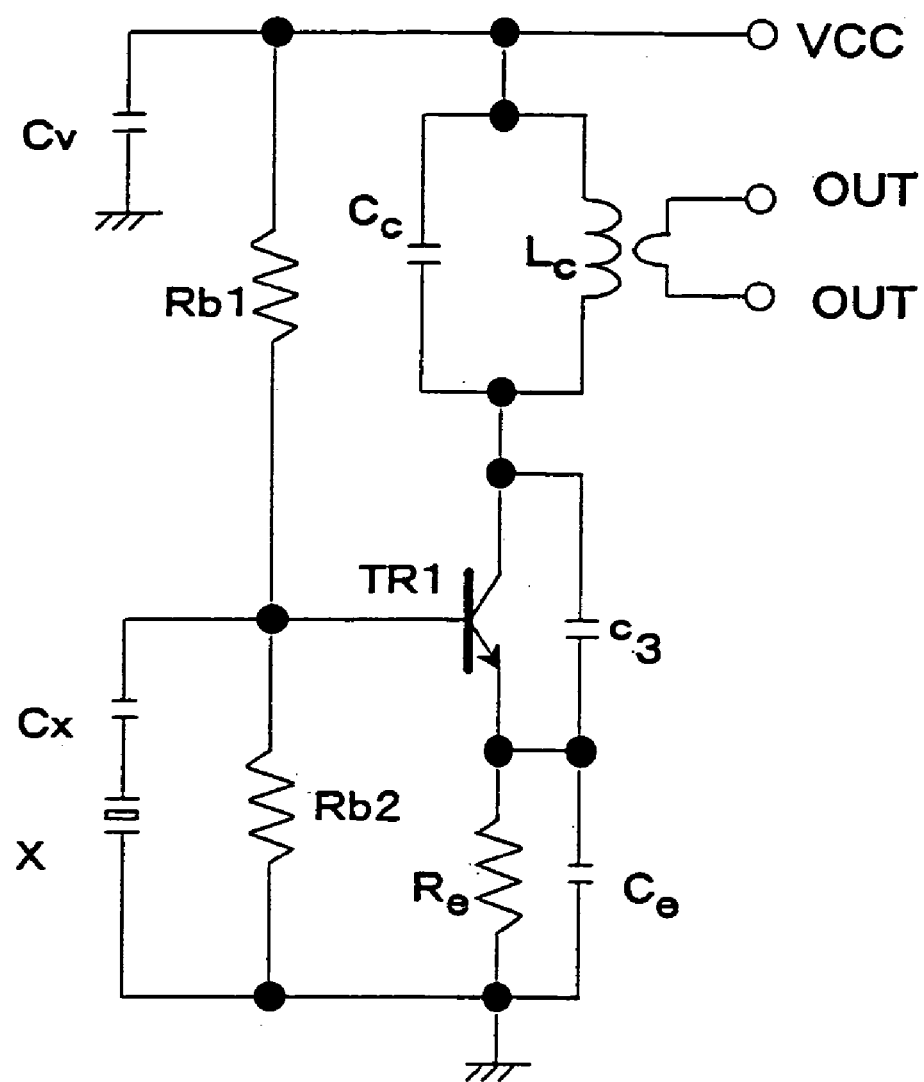
FIG. 24 is a circuit diagram of another conventional crystal oscillator.
Figure 25:
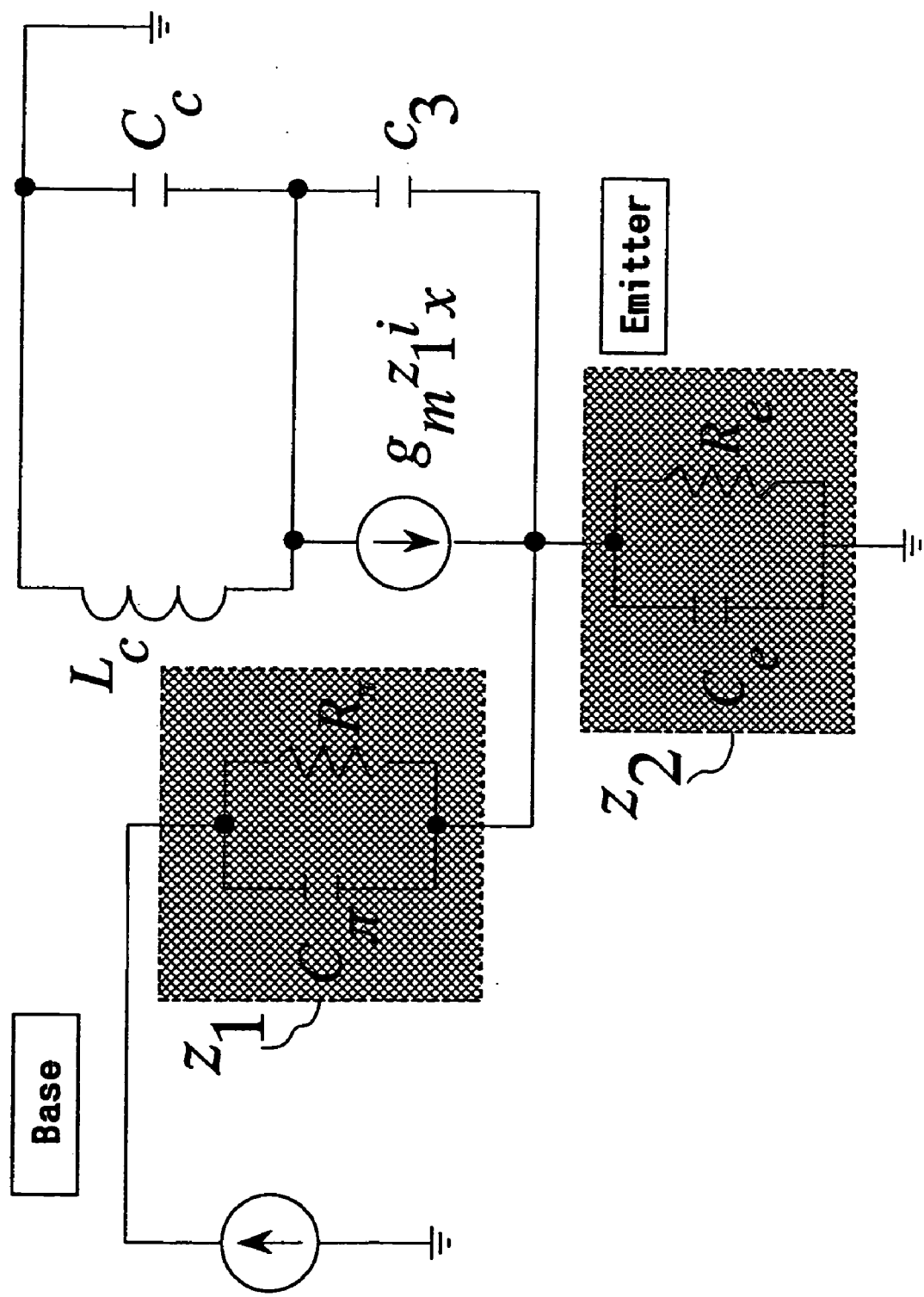
FIG. 25 is an equivalent circuit diagram of the latter conventional crystal oscillator.
Figure 26:
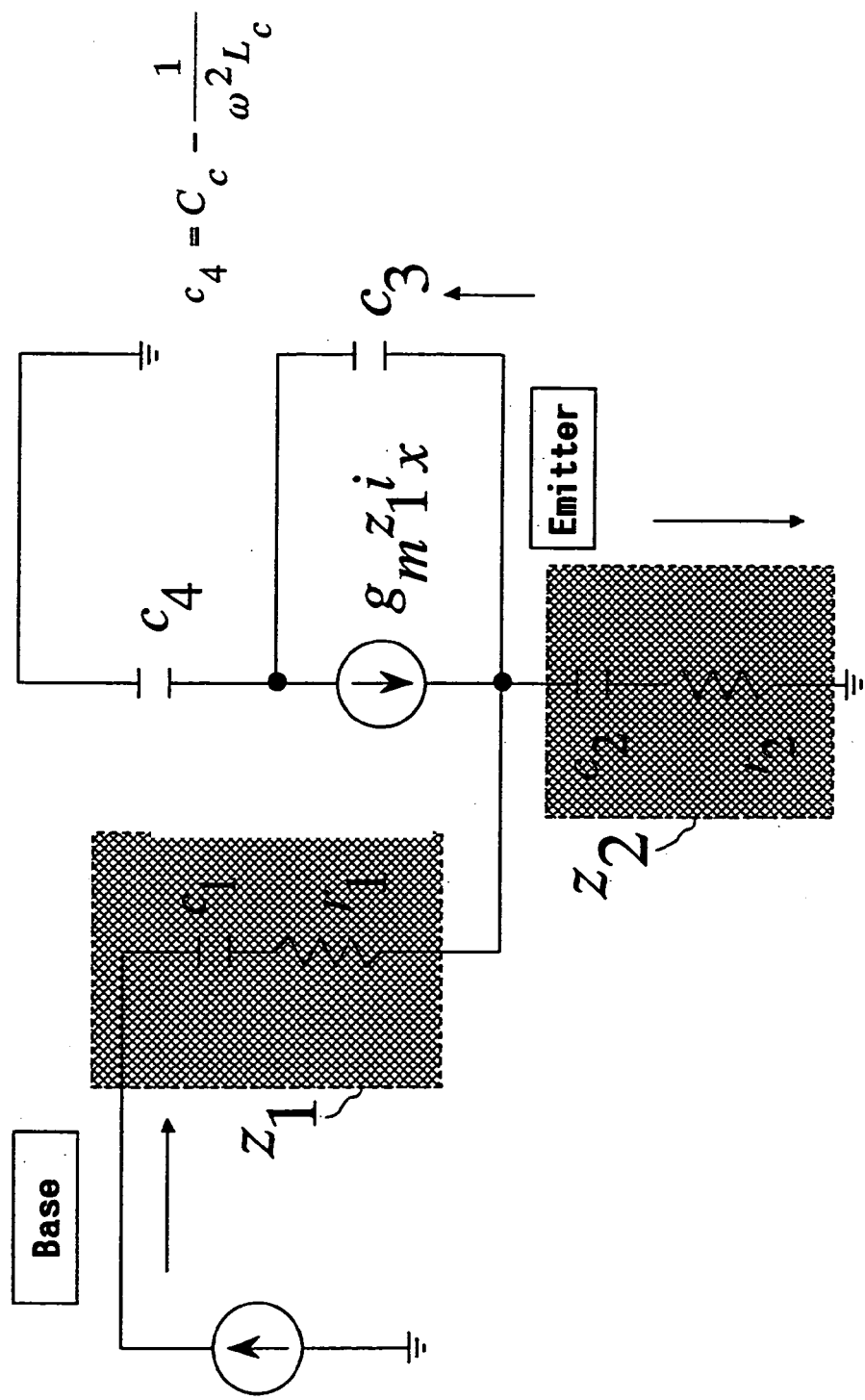
FIG. 26 is an equivalent circuit diagram of the conventional crystal oscillator.
Figure 27:
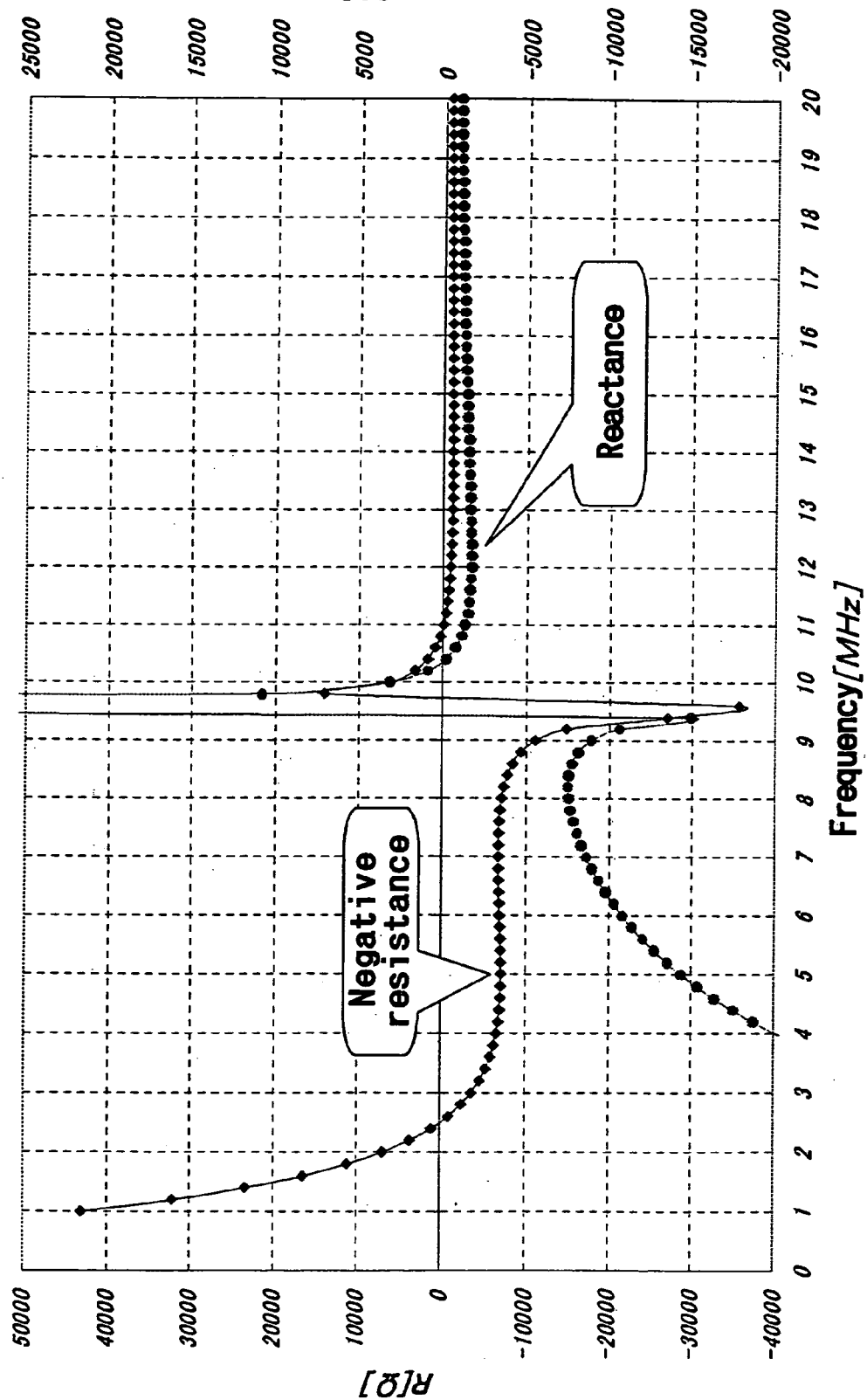
FIG. 27 is a graph showing frequency characteristics of the reactance and negative resistance of the conventional crystal oscillator.

This circuit is common to the conventional circuit of FIG. 24 in the connection of the capacitance $c_3$ between the collector and emitter of the transistor TR1 and in the omission of the base-emitter interterminal capacitance in the conventional Colpitts oscillation circuits, but the present invention apparently differs from the prior art example in the configuration between the collector of the transistor and the power supply Vcc.

That is, the conventional circuit of FIG. 24 and the present invention differ greatly in that the former has the parallel circuit of an inductance and a capacitance connected as a tuning circuit between the collector of the transistor and the power supply Vcc, whereas the latter has the resistance Rc connected between the collector and the power supply Vcc. That is, in the circuit of FIG. 24 the AC-wise reactance of the parallel circuit of the inductance and the capacitance determines the oscillation frequency, whereas in the present invention the resistance Rc does not affect the condition for determining the oscillation frequency.

As the result of various experiments conducted thereon, it was recognized that such a circuit as described above operates as a crystal oscillation circuit capable of not only oscillating with a smaller amount of current flow through the crystal vibrator but also producing various effects impossible to achieve in the past as described later on despite of its simple circuit configuration in which no capacitance needs to be connected between the base and emitter of the transistor as in the conventional Colpitts crystal oscillation circuit but instead a capacitance of a required value is connected between the collector and emitter of the transistor and a resistance element with no reactance component is connected between the collector of the transistor and the power supply.

A description will be given below of the operation of this circuit. Even if no capacitor is connected between the base and emitter of the transistor as in the present invention, there exists a base-emitter interterminal capacitance (about 2 pF or less) of the transistor itself, but the capacitance value is too small to induce oscillation. In the present invention the resistance Rc is connected between the collector of the transistor and the power supply Vcc and the collector output is fed back to the emitter by the capacitance $c_3$; the resistance Rc is intended to generate an oscillation signal voltage in the collector.

Figure 2:
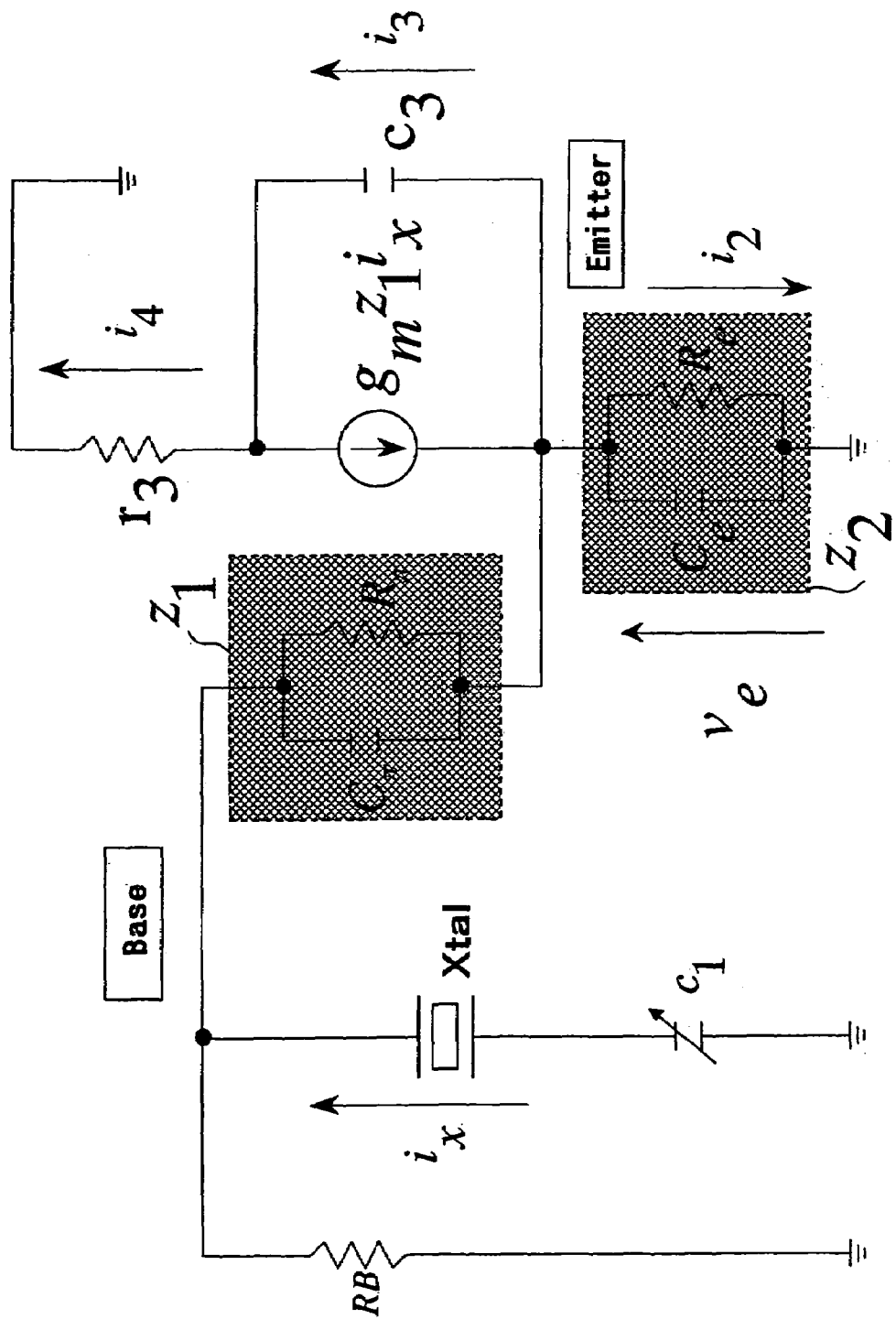
FIG. 2 is an equivalent circuit diagram of the crystal oscillation circuit of FIG. 1.
Figure 3:
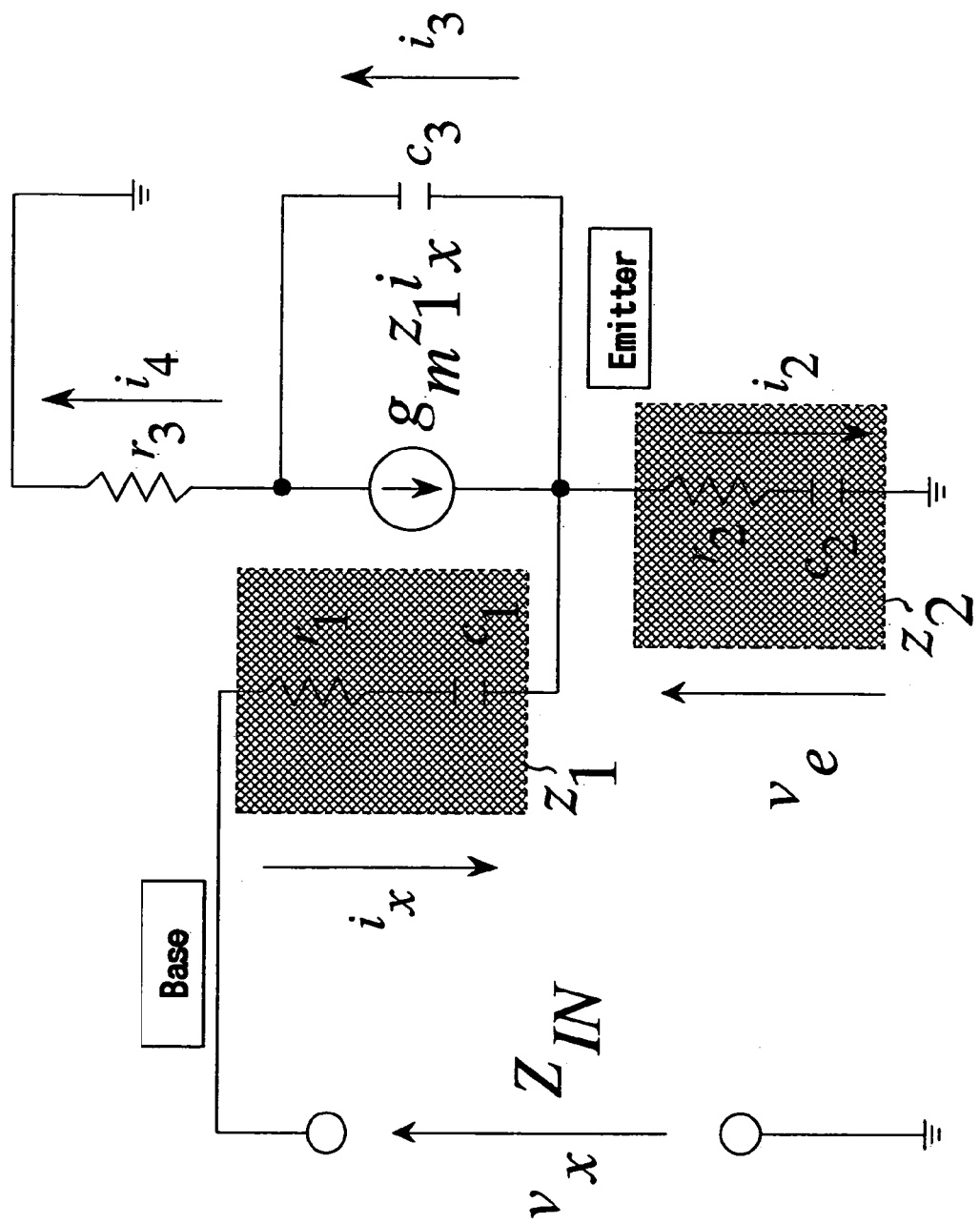
FIG. 3 is an equivalent circuit diagram of the crystal oscillation circuit of FIG. 1.

FIGS. 2 and 3 show equivalent circuits of the piezoelectric oscillator 1 of FIG. 1. FIG. 2 is an equivalent version of the crystal oscillator in which the base-emitter impedance of the transistor TR1 by a parallel circuit of a junction capacitance $C_\pi$ between the base and emitter of the transistor TR1 and its input resistance $R_\pi$ is represented by $z_1$, an impedance by a parallel circuit of the resistance $R_e$ between the emitter of the transistor TR1 and the ground is represented by $z_2$ and the mutual inductance of the transistor is represented by $g_m$; FIG. 3 shows an equivalent circuit of the crystal oscillator 1 in which the impedance $z_1$ and the impedance $z_2$ in FIG. 2 are replaced with a series circuit of a capacitance $c_1$ component and a resistance $r_1$ and a series circuit of a capacitance $c_2$ component and a resistance $r_2$ component, respectively.

In FIG. 3, the input impedance $Z_{IN}$ of the transistor TR1 is expressed by Equation (4) in FIG. 3 based on such a calculation procedure as set forth below.

Calculate the current flowing from the base to the emitter of the transistor.

$$i_x + g_m z_1 i_x = i_2 + i_3 + \ldots + i_x \lll g_m z_1 i_x$$

To facilitate the analysis, assume that the base current is negligibly small as compared with the collector current.

$$g_m z_1 i_x = i_2 + i_3$$

$$i_3 = g_m z_1 i_x - i_2 \tag{1}$$

Let the potential between the emitter and the ground GND be represented by $V_e$.

$$ve = z_2 i_2 = \frac{1}{j\omega c_3} i_3 + r_3(i_3 - g_m z_1 i_x) = \quad (2)$$

$$\left(\frac{1}{j\omega c_3} + r_3\right) i_3 - g_m z_1 r_3 i_x \ldots z_3 = \frac{1}{j\omega c_3} + r_3 = z_3 i_3 - g_m z_1 r_3 i_x$$

Substitute Eq. (1) into Eq. (2).

$$= z_3(g_m z_1 i_x - i_2) - g_m z_1 r_3 i_x$$

$$= g_m z_1 z_3 i_x - z_3 i_2 - g_m z_1 r_3 i_x$$

$$(z_2 + z_3) i_2 = g_m z_1 (z_3 - r_3) i_x$$

$$(z_2 + z_3) i_2 = \frac{g_m z_1}{j\omega c_3} i_x$$

$$i_2 = \frac{z_1}{z_2 + z_3} \frac{g_m}{j\omega c_3} i_x$$

Again, calculate the potential $V_e$ between the emitter and the ground GND.

$$v_e = z_2 i_2 = \frac{z_1 z_2}{z_2 + z_3} \frac{g_m}{j\omega c_3} i_x$$

Calculate the impedance $z_e$ of the emitter.

$$z_e = \frac{v_e}{i_x} = \frac{z_1 z_2}{z_2 + z_3} \frac{g_m}{j\omega c_3}$$

Add the base-side impedance $z_1$ to the emitter impedance to obtain the input impedance $Z_{IN}$.

$$z_{IN} = z_1 + \frac{z_1 z_2}{z_2 + z_3} \frac{g_m}{j\omega c_3} \quad (3)$$

Substitute the following impedance parameter into Eq. (3) to obtain $Z_{IN}$.

$$z_1 = r_1 + \frac{1}{j\omega c_1}, \, z_2 = r_2 + \frac{1}{j\omega c_2}, \, z_3 = r_3 + \frac{1}{j\omega c_3} \quad (4)$$

$$Z_{IN} = r_1 + \frac{1}{j\omega c_1} +$$

$$\frac{g_m}{j\omega c_3} \times \frac{1}{r_2 + r_3 + \frac{1}{j\omega}\left(\frac{1}{c_2} + \frac{1}{c_3}\right)} \left\{ r_1 r_2 - \frac{1}{\omega^2 c_1 c_2} + \frac{1}{j\omega}\left(\frac{r_2}{c_1} + \frac{r_1}{c_2}\right) \right\}$$

The input impedance $Z_{IN}$ is composed of a resistance component $R_{IN}$ and a reactance component $X_{IN}$.

$$Z_{IN} = R_{IN} + jX_{IN}$$

Calculate from Eq. (4) the resistance component $R_{IN}$ and the reactance component $X_{IN}$ as given by Eqs. (5) and (6), respectively.

$$R_{IN} = r_1 + \frac{1}{\{\omega c_3(r_2 + r_3)\}^2 + \left(\frac{c_3}{c_2} + 1\right)^2} \quad (5)$$

$$\left\{ \underbrace{\left(\frac{c_3}{c_2} + 1\right)\left(g_m r_1 r_2 - \frac{g_m}{\omega^2 c_1 c_2}\right)}_{\text{First Term}} - \underbrace{c_3(r_2 + r_3)\left(\frac{g_m r_2}{c_1} + \frac{g_m r_1}{c_2}\right)}_{\text{Second Term}} \right\}$$

$$X_{IN} = -\frac{1}{\omega c_1} - \frac{1}{\{\omega c_3(r_2 + r_3)\}^2 + \left(\frac{c_3}{c_2} + 1\right)^2} \quad (6)$$

$$\left\{ \omega c_3(r_2 + r_3)\left(g_m r_1 r_2 - \frac{g_m}{\omega^2 c_1 c_2}\right) + \frac{1}{\omega}\left(\frac{c_3}{c_2} + 1\right)\left(\frac{g_m r_2}{c_1} + \frac{g_m r_1}{c_2}\right) \right\}$$

Now, a description will be given of Eq. (5) that expresses the resistance component $R_{IN}$.

Figure 23:
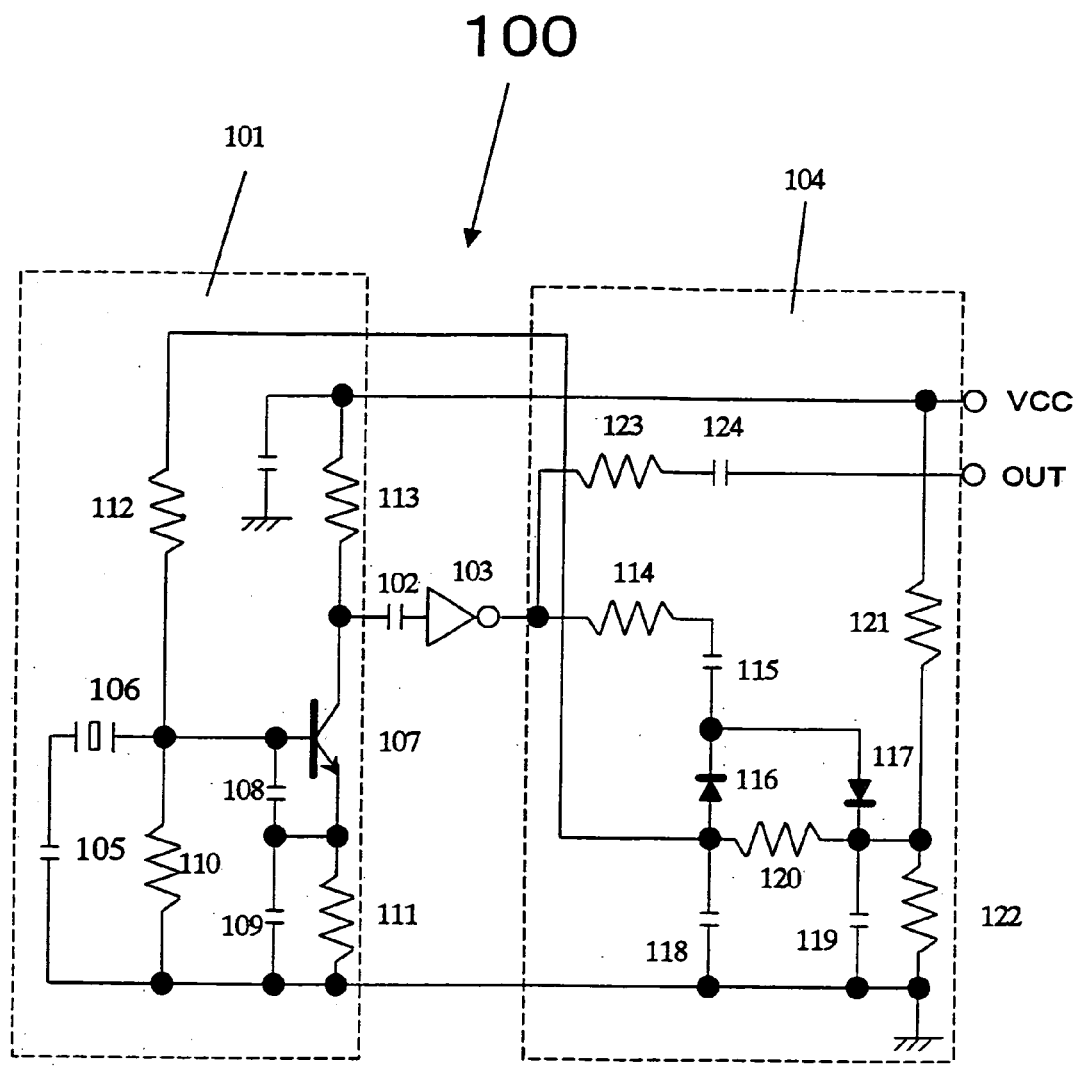
FIG. 23 is a circuit diagram of a conventional crystal oscillator.

The circuit configuration of the crystal oscillator with the capacitance $c_3 = 0$ F corresponds to the circuit configuration of the ordinary Colpitts type crystal oscillator adopted in the crystal oscillator of FIG. 23, and since the resistance component $R_{IN}$ of the input impedance $Z_{IN}$ in this case is given by an equation having the second term removed from Eq. (5), it can be understood that the second term in Eq. (5) is a negative resistance value determining element resulting from the circuit configuration according to the present invention.

As it will be seen from Eq. (5), as the resistance components $r_1$ and $r_2$ contained in the first and second terms increase, the first term tends to suppress the occurrence of the negative resistance, whereas the second term tends to promote the occurrence of the negative resistance.

The above matters concerning Eq. (5) will be explained below concretely using simulation results shown in FIGS. 4 and 5.

To facilitate better understanding, a description will be given first, with reference to FIG. 4, of the negative resistance and the like obtained by the simulation of the conventional Colpitts type oscillator.

Figure 4:
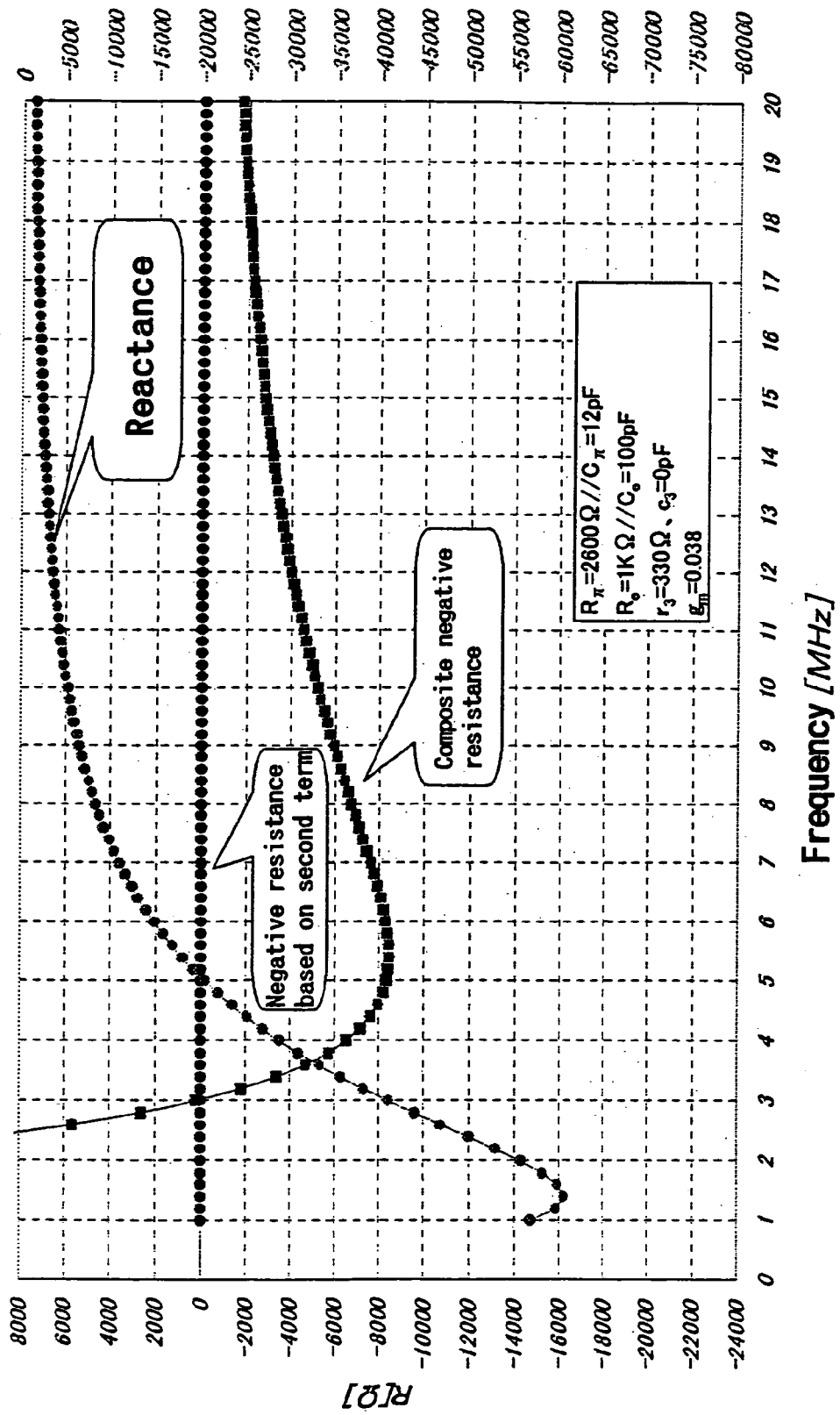
FIG. 4 is a graph showing the results of the simulation of a negative resistance-frequency characteristic.

FIG. 4 shows values of the resistance component $R_{IN}$ based on Eq. (5) and the reactance component $X_{IN}$ in the input impedance $Z_{IN}$ of the Colpitts type crystal oscillator of FIG. 23, obtained by the simulation of the oscillator with parameters of respective circuit elements of the FIG. 2 equivalent circuit set as follows: $c_3 = 0$ F, $R_\pi = 2600\Omega$, $C_\pi = 12$ pF, $R_e = 1$ k$\Omega$, $C_e = 100$ pF (a value set taking into account the base-emitter capacitance 108 in FIG. 23), $r_3 = 330\Omega$ and $g_m = 0.038$. The oscillation frequency at which the negative resistance reaches its peak value is approximately 5 MHz to 6 MHz, and the peak value is about $-8000\Omega$.

Figure 5:
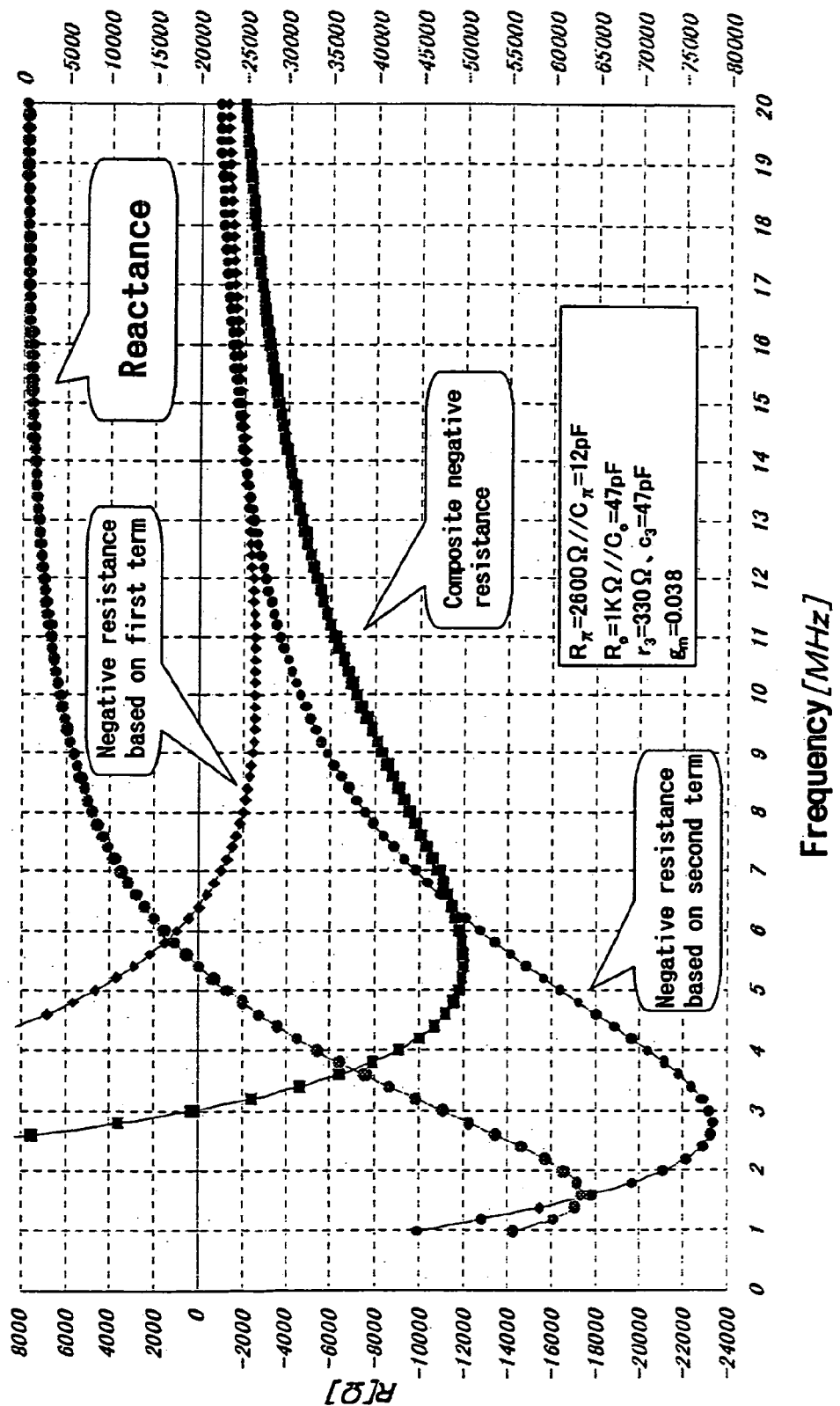
FIG. 5 is a graph showing the results of the simulation of a negative resistance-frequency characteristic.

On the other hand, FIG. 5 shows values of the resistance component $R_{IN}$, the reactance component $X_{IN}$ and the negative resistance based on only the first or second term of Eq. (5) in the input impedance $Z_{IN}$ of the FIG. 1 crystal oscillation circuit, obtained by the simulation of the oscillation circuit with the circuit parameters of the FIG. 2 equivalent circuit set as follows: $R_\pi = 2600\Omega$, $C_\pi = 12$ pF, $R_e = 1$ k$\Omega$, $C_e = 47$ pF, $r_3 = 330\Omega$ $c_3 = 47$ pF and $g_m = 0.038$.

As shown in FIG. 5, in the circuit configuration based on the first term alone (without the base-emitter interterminal capacitance 108 in the ordinary Colpitts type oscillator) the negative resistance-frequency characteristic shifts toward the high frequency side as compared with that of the Colpitts type crystal oscillator of FIG. 4 and the negative resistance decreases, whereas in the circuit configuration based only on the second term of Eq. (5) the negative resistance-frequency characteristic shifts toward the low frequency side and the negative resistance increases; therefore, as the result of the addition of the negative resistance-frequency characteristics based on the first and second terms, the negative resistance of the crystal oscillator 1 shows, though not provided with the base-emitter interterminal capacitance, such a characteristic as identified as the composite negative resistance which reaches its peak value (about −12000Ω) at oscillation frequencies ranging from approximately 5 MHz to 6 MHz nearly equal to those in the prior art.

Figure 6:
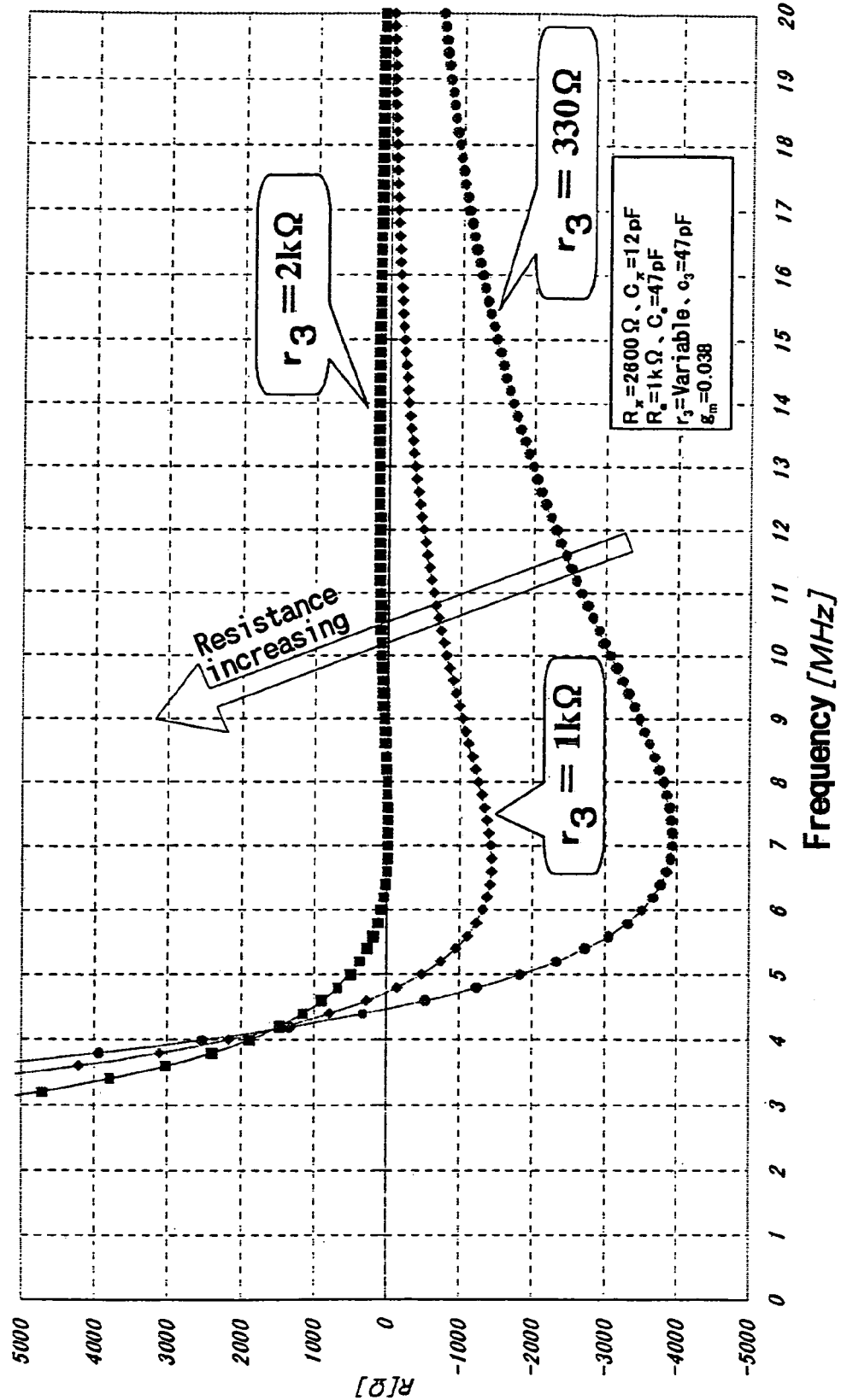
FIG. 6 is a graph showing the results of the simulation of a negative resistance-frequency characteristic related to Equation 1.
Figure 7:
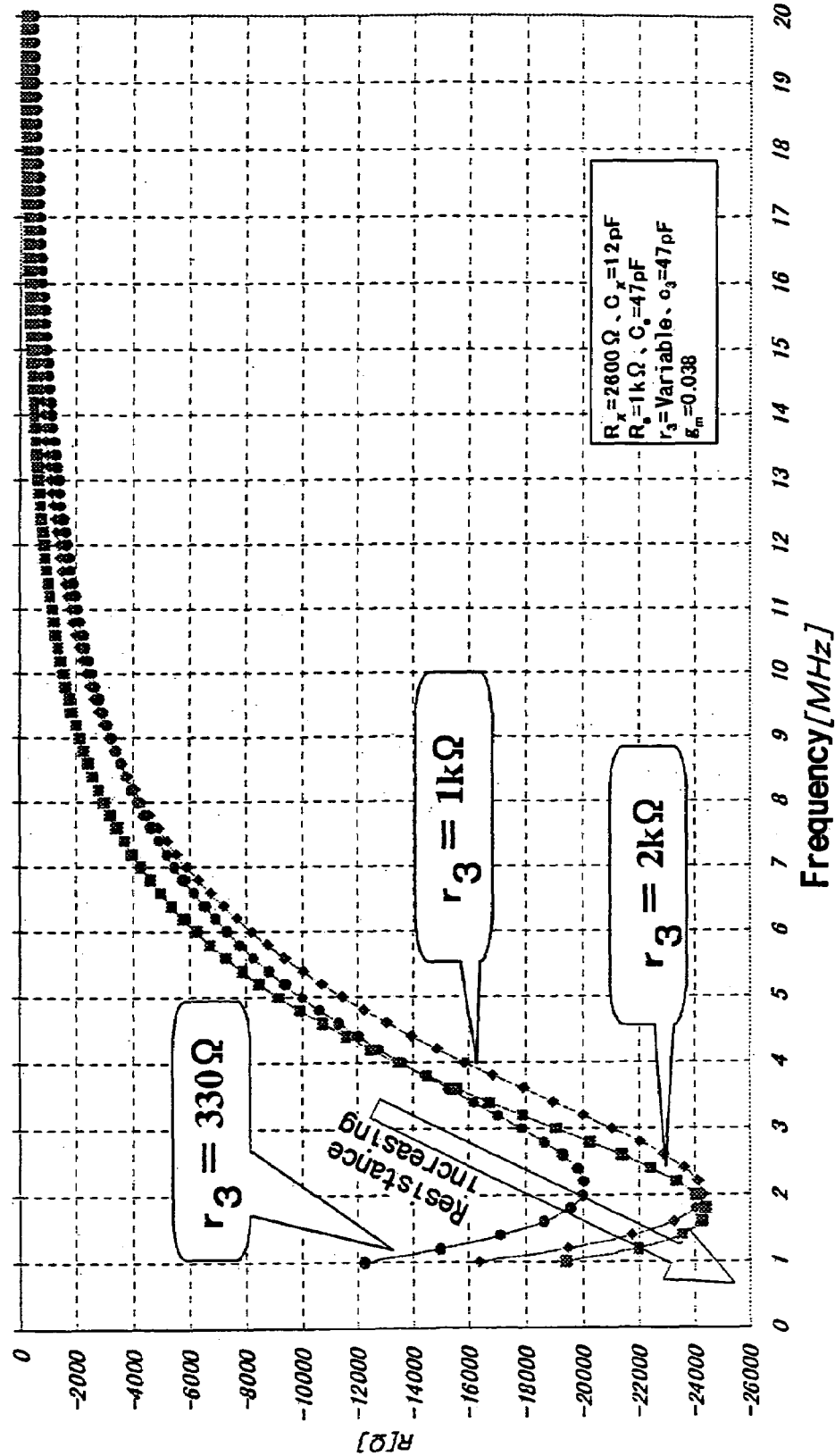
FIG. 7 is a graph showing the results of the simulation of a negative resistance-frequency characteristic related to Equation 2.
Figure 8:
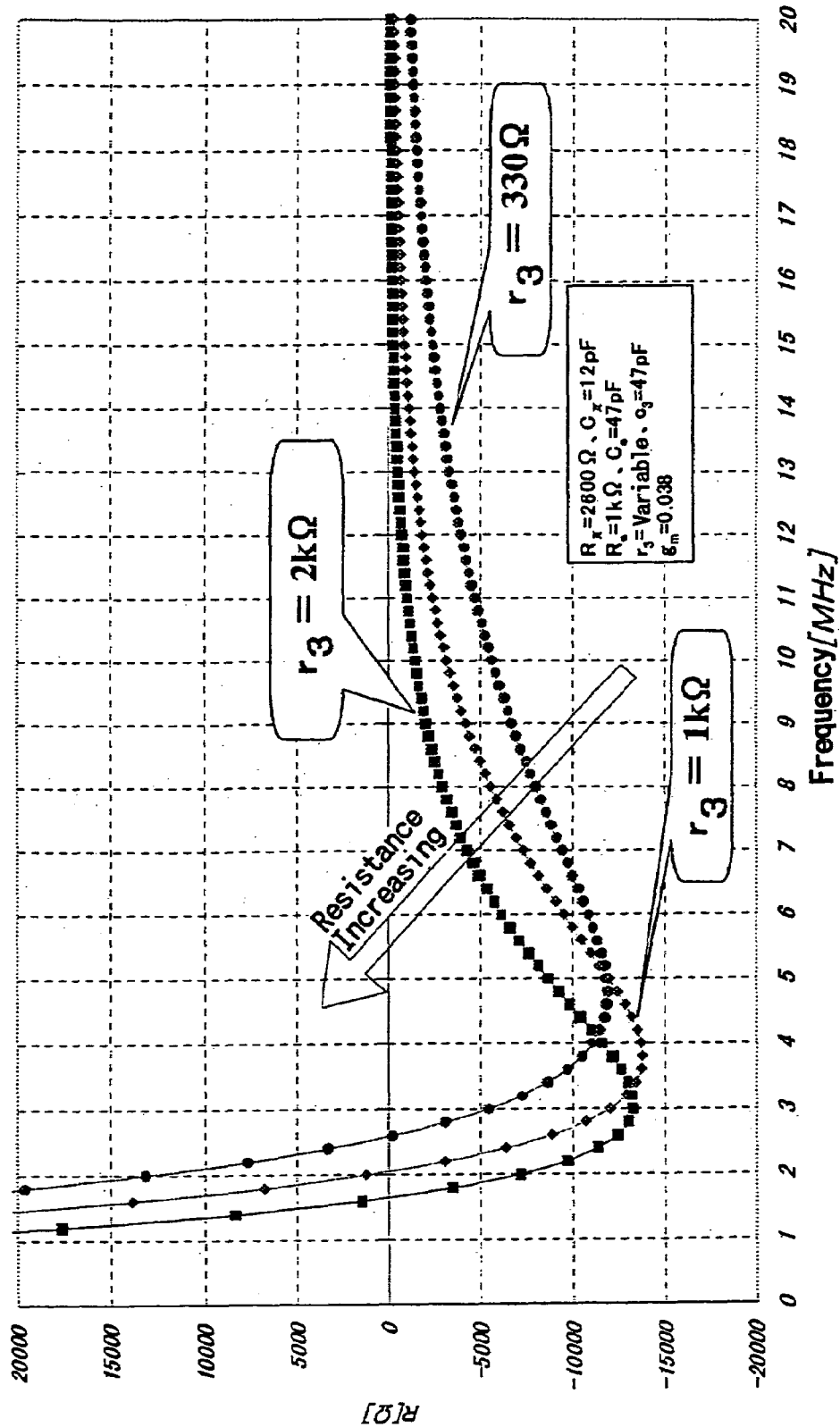
FIG. 8 is a graph showing the results of the simulation of the negative resistance-frequency characteristic of the crystal oscillator circuit according to the present invention.

FIGS. 6 through 8 show the relationships between the negative resistance-frequency characteristic and the value of the collector load resistance $r_3$; FIG. 6 shows the results of the simulation of the negative resistance-frequency characteristic based only on the first term of Eq. (5). FIG. 7 shows the results of the simulation of the negative resistance-frequency characteristic based only on the second term of Eq. (5), and FIG. 8 shows the results of the simulation of the negative resistance-frequency characteristic of the FIG. 1 crystal oscillator 1 based Eq. (5).

The respective circuit parameters of the FIG. 2 circuit configuration in the simulation the results of which are shown in FIG. 4 were as follows: $R_\pi=2600\Omega$, $C_\pi=12$ pF, $R_e=1$ kΩ, $C_e=47$ pF, $c_3=47$ pF, $g_m=0.0378$, collector load resistance $r_3=330\Omega$, 1 kΩ and 2 kΩ.

As shown in FIG. 6, according to the negative resistance-frequency characteristics based only on the first term of Eq. (5) that expresses the resistance component $R_{IN}$, the value of the negative resistance becomes more sufficient with a decrease in the collector load resistance $r_3$ and the negative resistance reaches its peak value at higher frequencies as the value of the collector load resistance $r_3$ decreases.

In contrast thereto, as shown in FIG. 7, according to the negative resistance-frequency characteristics based only on the second term of Eq. (5) that expresses the resistance component $R_{IN}$, the value of the negative resistance becomes more sufficient with an increase in the collector load resistance $r_3$; that is, the illustrated negative resistance-frequency characteristic varies in the direction opposite to that of the characteristic shown in FIG. 6.

Incidentally, the negative resistance-frequency characteristics shown in FIG. 7 also have a tendency to provide the peak value of the negative resistance at higher frequencies with a decrease in the collector load resistance $r_3$ as in the case of FIG. 6.

Accordingly, since the negative resistance-frequency characteristic of the crystal oscillator 1 according to the present invention is a combined version of the negative resistance-frequency characteristics of FIGS. 6 and 7 based on Eq. (5) that expresses the input impedance resistance component, load capacitance-frequency characteristic variations caused by collector load resistance value changes cancel each other, with the result that even if the value of the collector load resistance $r_3$ changes, the negative resistance-frequency characteristic undergoes a small variation as shown in FIG. 8.

Figure 9:
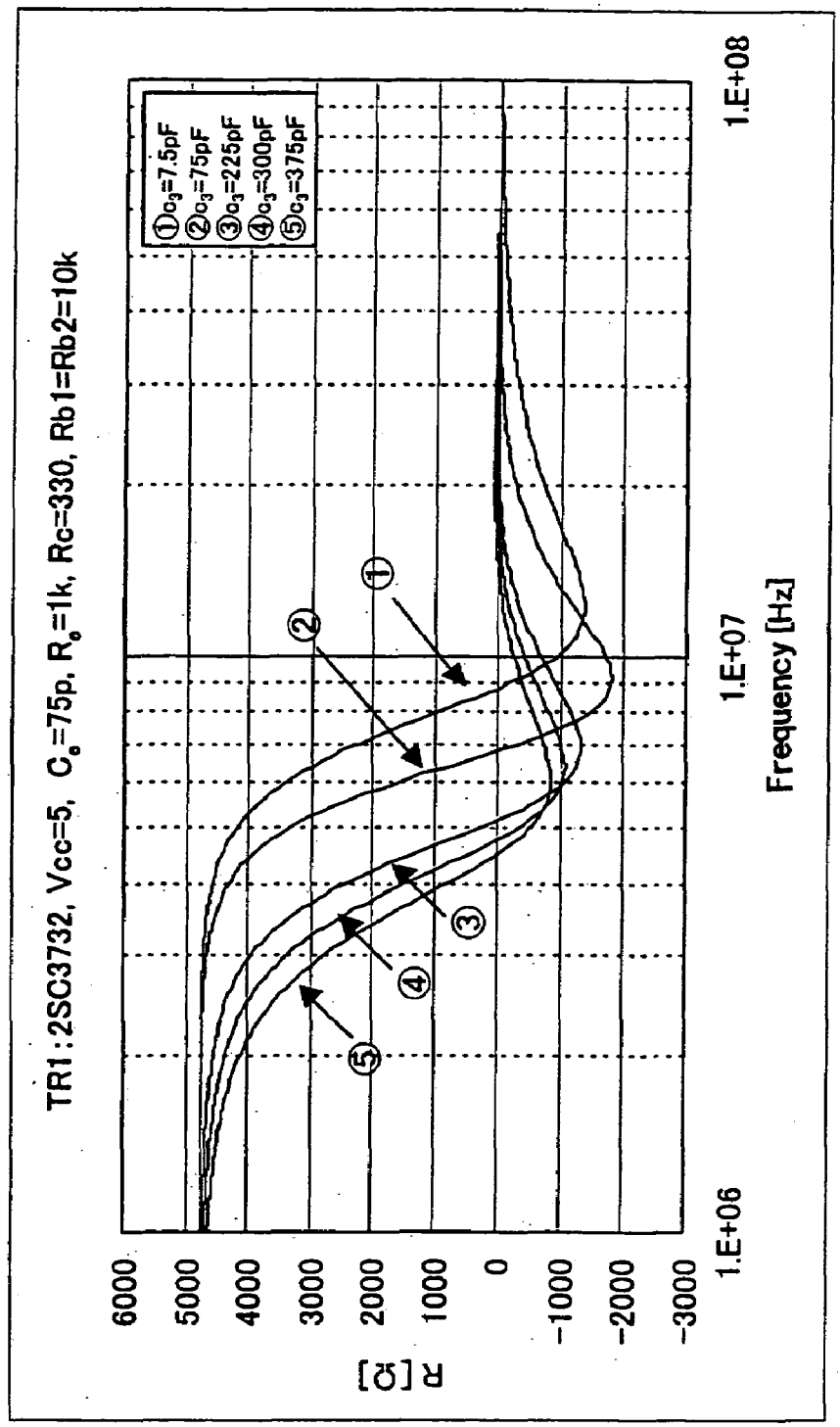
FIG. 9 is a graph showing the results of the simulation of the negative resistance-frequency characteristic of the crystal oscillator circuit according to the present invention.
Figure 10:
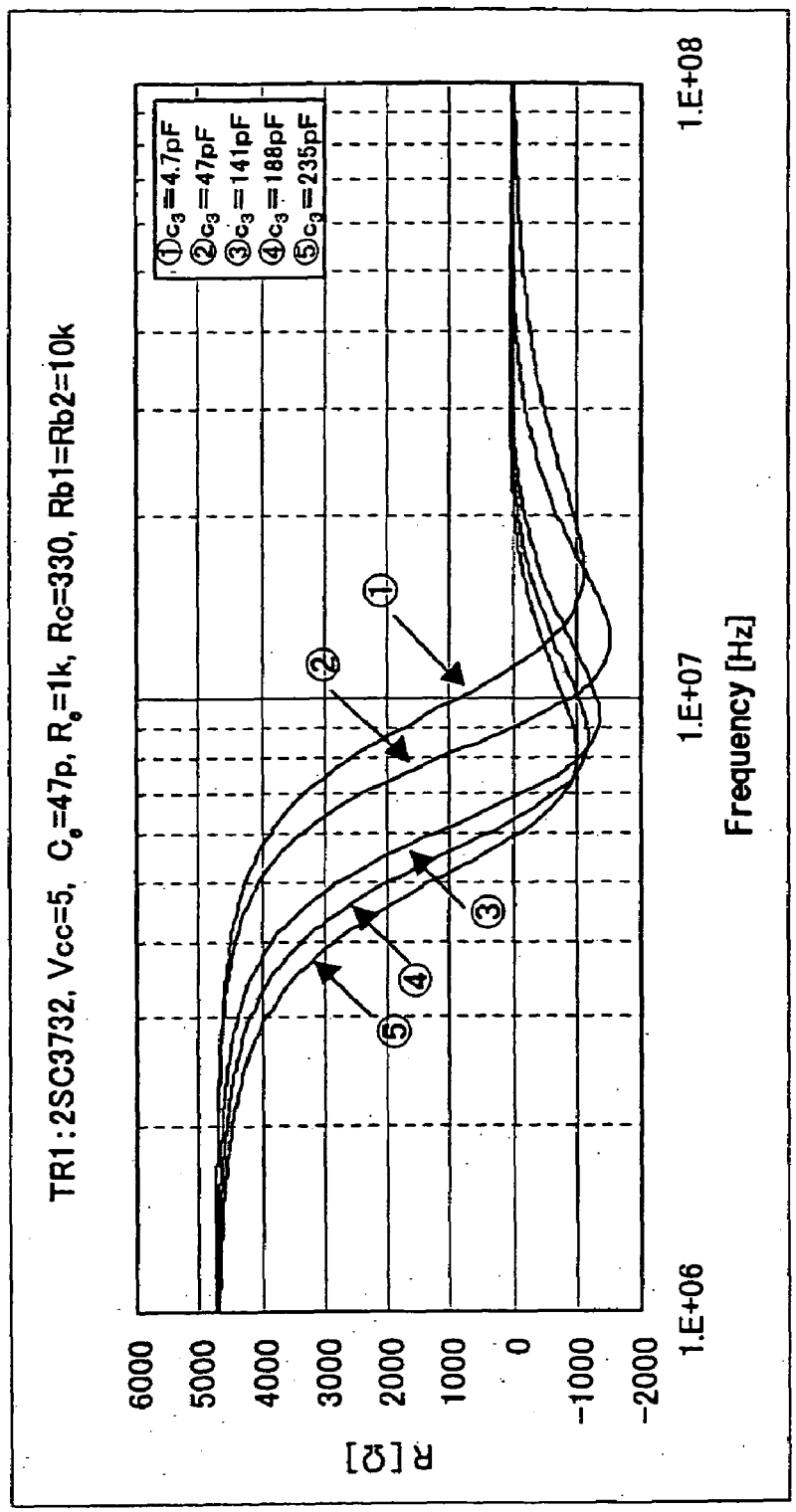
FIG. 10 is a graph showing the results of the simulation of the negative resistance-frequency characteristic of the crystal oscillation circuit according to the present invention.

FIGS. 9 and 10 show negative resistance-frequency characteristics obtained with the value of capacitance $c_3$ set at $0.1C_e$, $C_e$, $3C_e$, $4C_e$ and $5C_e$, respectively, with respect to the capacitance $C_e$; FIG. 9 shows characteristics in the case of $C_e=75$ pF and FIG. 10 shows characteristics in the case of $C_e=47$ pF. In FIGS. 9 and 10, ①, ②, ③, ④ and ⑤ indicates negative resistance-frequency characteristics obtained in the cases of $c_3=0.1C_e$, $c_3=C_e$, $c_3=3C_e$, $c_3=4C_e$ and $c_3=5C_e$, respectively.

In any of these instances shown in FIGS. 9 and 10, the peak value of the negative resistance does not greatly change with the value of the capacitance $C_3$ and the negative resistance value is around −1000Ω; and it will be seen that the values of the capacitances $C_3$ and $C_e$ mat preferably be set substantially equal so as to obtain the maximum peak value of the negative resistance as in the case of the characteristic ②.

Figure 11:
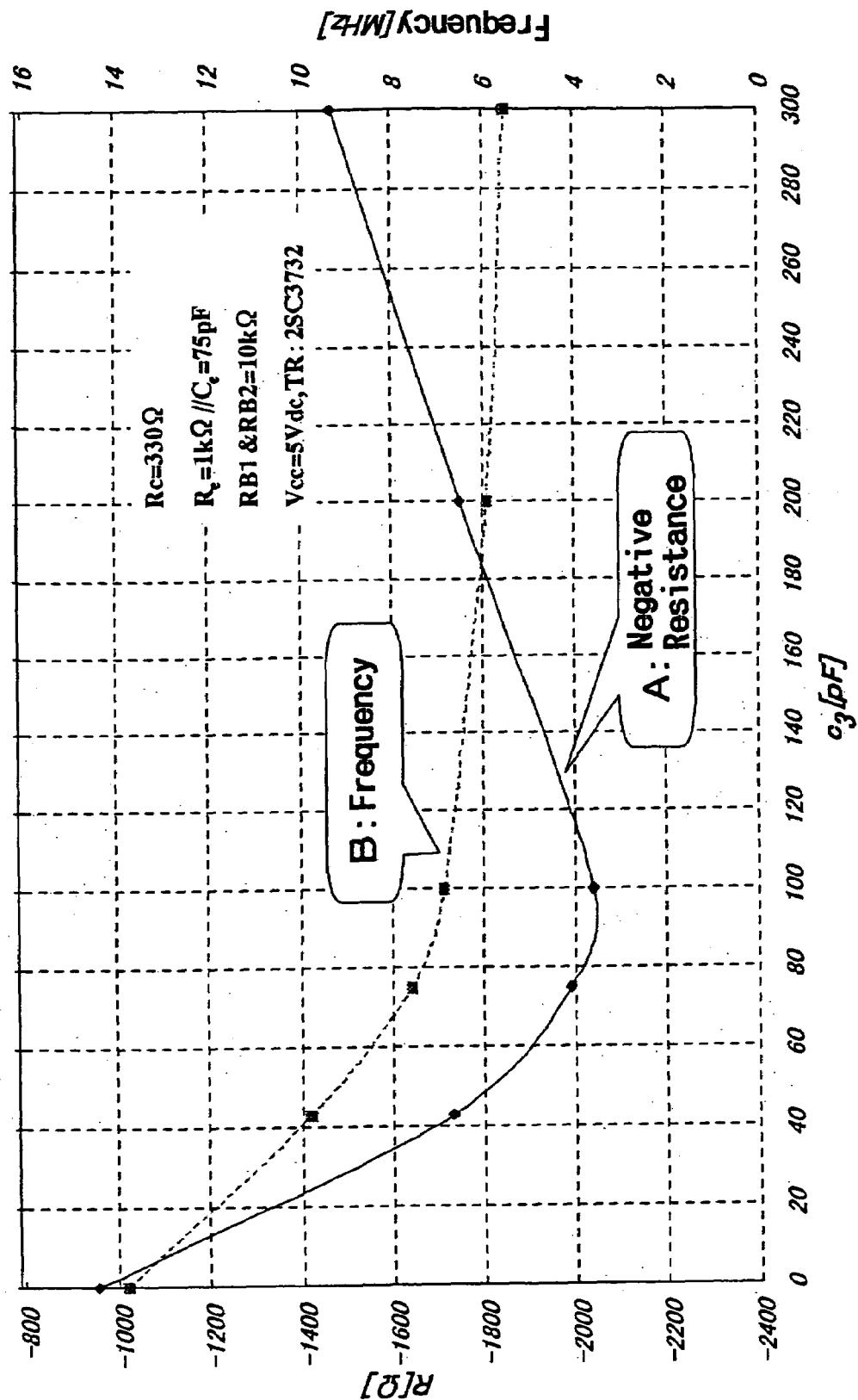
FIG. 11 is a graph showing actual measurement results of the negative resistance-frequency characteristic of the crystal oscillator circuit according to the present invention.

The solid line A in FIG. 11 indicates a negative resistance variation characteristic based on negative resistance values in the crystal oscillator 1 measured for values of the capacitance $c_3$ (0 pF, 42 pF, 75 pF, 100 pF, 200 pF and 30 pF) with the capacitance $C_e=75$ pF; and the broken line B indicates a frequency variation characteristic based on oscillation frequencies measured for the same values of the capacitances $C_e$ and $c_3$ as mentioned above.

It will be seen from FIG. 11 that the negative resistance value becomes maximum when the capacitances $C_e$ and $c_3$ are set at values nearly equal to each other and that the frequency variations are small when the capacitance are set in the range of $c_3 \geq C_e$.

Incidentally, as described above, the negative resistance-frequency characteristic is stable for the values of the capacitance $c_3$ up to 5 times the value of the capacitance $C_e$, and the peak value of the negative resistance-frequency characteristic is particularly stable within the range of $0.1C_e < c_3 < 3C_e$; in practice, however, it can be inferred that the negative resistance-frequency characteristic would be stable over the range of the values of the capacitance $c_3$ up to approximately 10 times the value of the capacitance $C_e$.

Next, a description will be given of the current flow through the crystal vibrator (hereinafter referred to as a crystal vibrator current) which is one of the features of the crystal oscillator according to the present invention.

Figure 12:
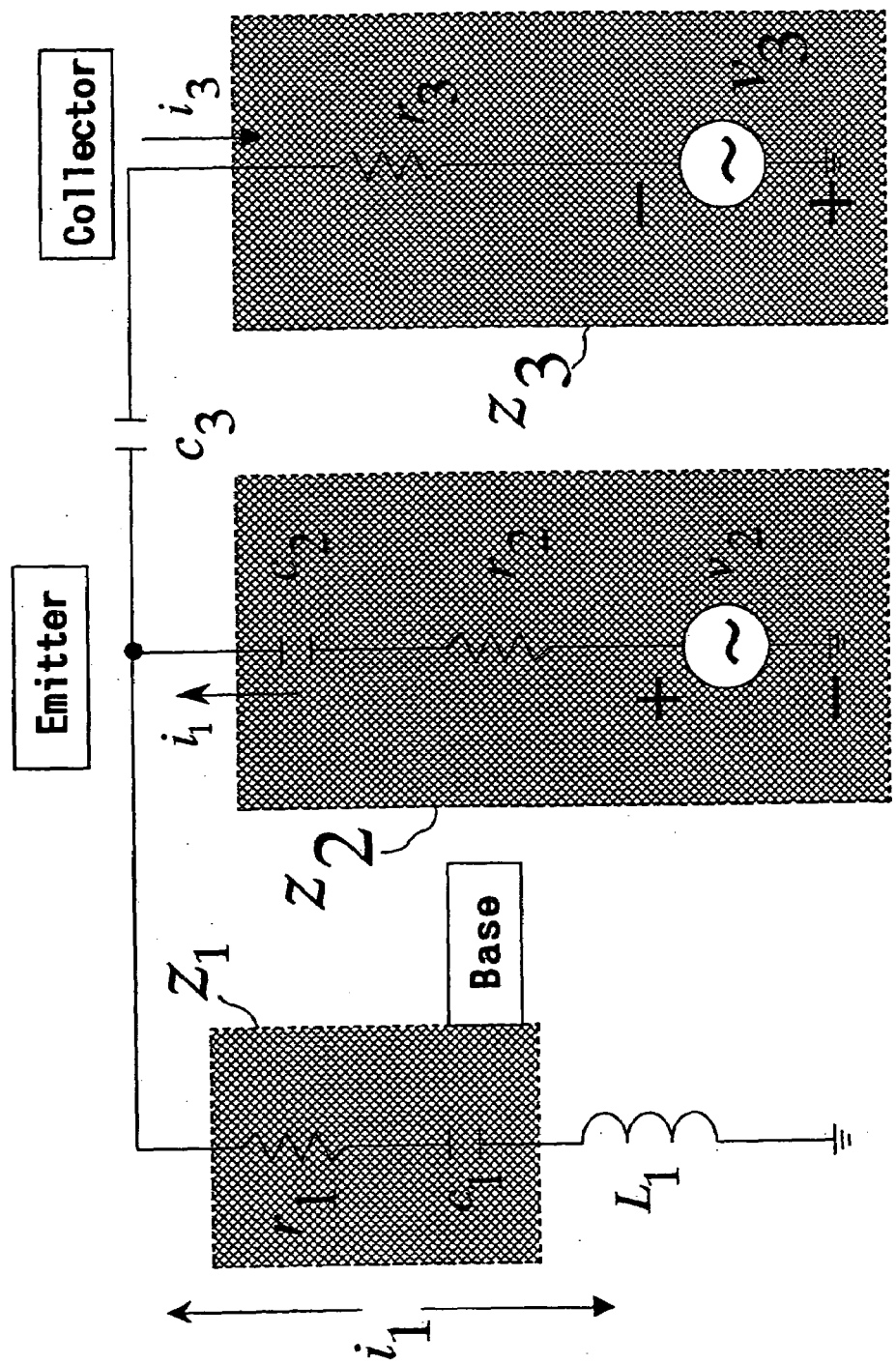
FIG. 12 is an equivalent circuit diagram of the crystal oscillator circuit according to the present invention.

FIG. 12 is an equivalent circuit of the crystal oscillator 1 during steady state oscillation, in which a signal source $v_2$ is connected between the emitter of the transistor and the ground and a signal source $v_3$ opposite in phase to the signal source $v_2$ is connected between the collector of the transistor and the ground.

Incidentally, in the illustrated equivalent circuit the parallel circuit of the resistance $R_e$ and the capacitance $C_e$ in the crystal oscillator 1 is replaced with an equivalent series circuit, the crystal vibrator is replaced with an inductance component $L_1$ and the parallel circuit of the base-emitter interterminal junction capacitance $C_\pi$ of the transistor TR1 and its input resistance $R_\pi$ is replaced with an equivalent series circuit of a resistance $r_1$ and a capacitance $c_1$.

Based on the equivalent circuit of FIG. 12, the crystal vibrator current can be calculated as follows:

$v_3=0$ $$i'_2 = i'_1 + i'_3 \quad (7)$$

$$\frac{v_2}{i'_2} = z_2 + \frac{z_1 z_3}{z_1 + z_3} = \frac{z_1 z_2 + z_2 z_3 + z_3 z_1}{z_1 + z_3}$$

$$w = z_1 z_2 + z_2 z_3 + z_3 z_1 \quad (8)$$

From Eqs. (7) and (8), we obtain Eq. (9).

$$i'_2 = \frac{z_1 + z_3}{w} v_2 \quad (9)$$

-continued $$z_1 i'_1 = z_3 i'_3, \; i'_3 = \frac{z_1}{z_3} i'_1 \quad (10)$$

Substitution of Eq. (10) into Eq. (7) gives Eq. (11).

$$i'_2 = i'_1 + \frac{z_1}{z_3} i'_1 = \left(1 + \frac{z_1}{z_3}\right) i'_1 = \frac{z_1 + z_3}{z_3} i'_1 \quad (11)$$

From Eqs. (9) and (11), we obtain Eq. (12).

$$i'_2 = \frac{z_1 + z_3}{w} v_2 = \frac{z_1 + z_3}{z_3} i'_1, \; i'_1 = \frac{z_3}{w} v_2 \quad (12)$$

Calculate the each constitution of $z'_1$, $z_2$ and $z_3$.

$$z'_1 = r_1 + \frac{1}{j\omega c'_1} = r_1 + \frac{1}{j\omega}\left(\frac{1}{c_1} - \omega^2 L_1\right), \; \frac{1}{c'_1} = \frac{1}{c_1} - \omega^2 L_1,$$

$$z_2 = r_2 + \frac{1}{j\omega c_2}, \; z_3 = r_3 + \frac{1}{j\omega c_3}$$

$$w = z'_1 z_2 + z_2 z_3 + z_3 z'_1$$

$$= \left(r_1 + \frac{1}{j\omega c'_1}\right)\left(r_2 + \frac{1}{j\omega c_2}\right) + \left(r_2 + \frac{1}{j\omega c_2}\right)\left(r_3 + \frac{1}{j\omega c_3}\right) +$$

$$\left(r_3 + \frac{1}{j\omega c_3}\right)\left(r_1 + \frac{1}{j\omega c'_1}\right)$$

$$= r_1 r_2 + r_2 r_3 + r_3 r_1 - \frac{1}{\omega^2}\left(\frac{1}{c'_1 c_2} + \frac{1}{c_2 c_3} + \frac{1}{c_3 c'_1}\right) +$$

$$\frac{1}{j\omega}\left(\frac{r_2 + r_3}{c'_1} + \frac{r_1 + r_3}{c_2} + \frac{r_1 + r_2}{c_3}\right)$$

$$= p - jq$$

$$p = r_1 r_2 + r_2 r_3 + r_3 r_1 - \frac{1}{\omega^2}\left(\frac{1}{c'_1 c_2} + \frac{1}{c_2 c_3} + \frac{1}{c_3 c'_1}\right),$$

$$q = \frac{1}{\omega}\left(\frac{r_2 + r_3}{c'_1} + \frac{r_1 + r_3}{c_2} + \frac{r_1 + r_2}{c_3}\right)$$

The effective current $i'_1$ by Eq. (12) is expressed by Eq. (13).

$$i'_1 = \frac{z_3}{w} v_2 \quad (13)$$

$$= \frac{v_2}{p^2 + q^2}\left(r_3 + \frac{1}{j\omega c_3}\right)(p + jq)$$

$$= \frac{v_2}{p^2 + q^2}\left\{r_3 p + \frac{q}{\omega c_3} + j\left(r_3 q - \frac{p}{\omega c_3}\right)\right\}$$

$$|i'_1| = \frac{v_2}{p^2 + q^2}\sqrt{\left(r_3 p + \frac{q}{\omega c_3}\right)^2 + \left(r_3 q - \frac{p}{\omega c_3}\right)^2}$$

An equivalent circuit with $v_2=0$ and the direction of current are shown.

Similarly, a vibrator current $i''_1$ is calculated by Eq. (14).

$$v_2 = 0 \quad (14)$$

-continued $$i''_1 = \frac{z_2}{w} v_3$$

The effective current is calculated by Eq. (15).

$$|i''_1| = \frac{v_3}{p^2 + q^2}\sqrt{\left(p r_2 + \frac{q}{\omega c_2}\right)^2 + \left(q r_2 - \frac{p}{\omega c_2}\right)^2} \quad (15)$$

A vibrator current i1 is calculated by Eq. (16).

$$|i1| = |i'_1| + |i''_1| \quad (16)$$

Figure 13:
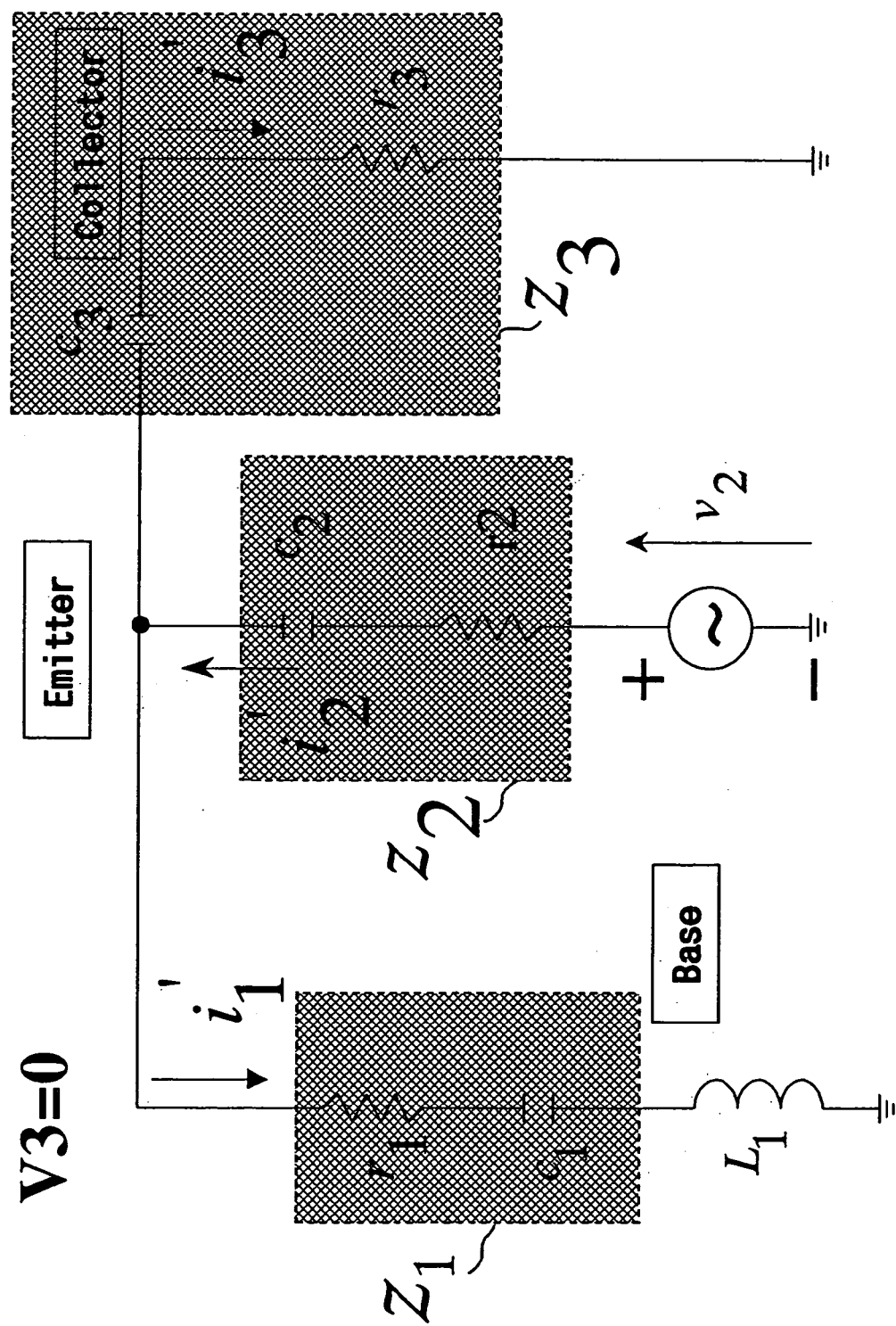
FIG. 13 is an equivalent circuit diagram of the crystal oscillator circuit according to the present invention.
Figure 14:
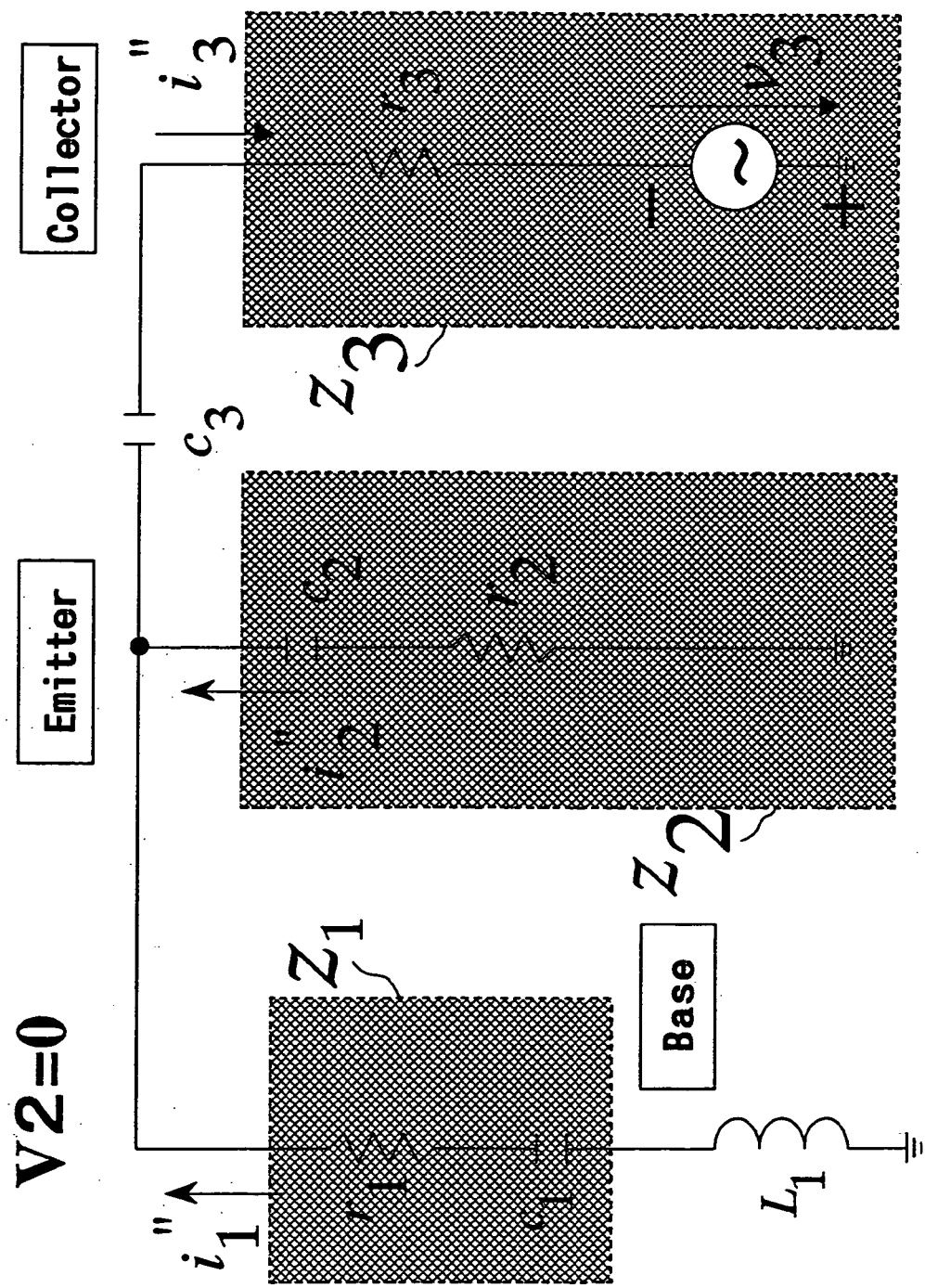
FIG. 14 is an equivalent circuit diagram of the crystal oscillator circuit according to the present invention.

The crystal vibrator current i1 was calculated using the FIG. 12 equivalent circuit with $v_3=0$V as depicted in FIG. 13 and the FIG. 12 equivalent circuit with $v_2=0$V as depicted in FIG. 14.

Figure 15:
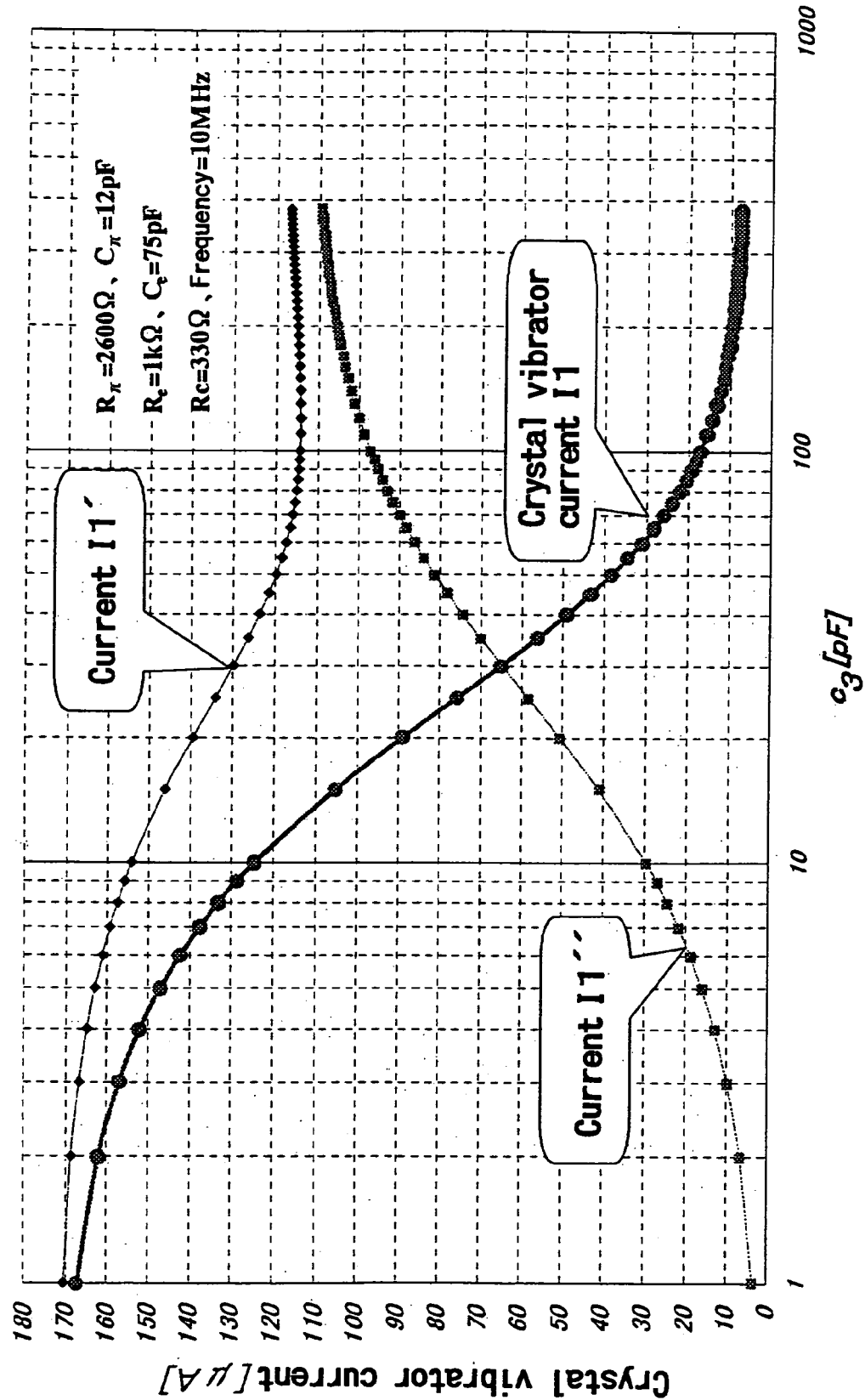
FIG. 15 is a graph showing a crystal vibrator current capacity characteristic of the crystal oscillator according to the present invention.

FIG. 15 shows the relationship between the capacitance $c_3$ and the crystal vibrator current i1 and, for the purpose of reference, between the capacitance $c_3$ and a current i' or i", obtained by the simulation conducted following the above calculation procedure; the circuit parameters used are $R_\pi=2600\Omega$, $C_\pi=12$ pF, $R_e=1$ k$\Omega$, $C_e=75$ pF, Rc=330$\Omega$ and the oscillation frequency is 10 MHz.

As is evident from FIG. 15, when the value of the capacitance $c_3$ exceeds 0.7 pF (in excess of $0.1C_e$), the value of the crystal vibrator current i1 have a tendency to abruptly decrease; that is, the crystal vibrator current i1 can be reduced.

Further, when $c_3=75$ pF or more ($c_3 \leq C_e$), the amount of change in the crystal vibrator current i1 is also small; hence, the crystal vibrator can be operated stably with a low consumption of current.

And, taking into account the simulation results of the negative resistance-frequency characteristic shown in FIGS. 9, 10 and 11, the capacitance $c_3$ needs to be set at a value larger than 0.1 times that of the capacitance $C_e$ to obtain a stable negative resistance-frequency characteristic and implement reduction of the crystal vibrator current at practical levels; furthermore, the stability of the negative resistance-frequency characteristic can be further increased simply by setting the value of the capacitance $c_3$ in the range of $0.1C_e < c_3 < 3C_e$.

Moreover, when the oscillation frequency does not greatly change with variations in the value of the capacitance $c_3$, changes in the value of the capacitance $c_3$ with temperature changes do not exert a great influence on the frequency-temperature characteristic of the crystal vibrator; in the case of implementing such a characteristic and a stable negative resistance-frequency characteristic and achieving reduction of a change in the amount of crystal vibrator current with a change in the value of the capacitance $c_3$, it is desirable to set the value of the capacitance $c_3$ be set in the range of $C_e \leq c_3 < 3C_e$.

The present invention is also applicable to crystal oscillators of the circuit configurations described below, and any of the circuit configurations produces the same effects as described above.

Other embodiments of the present invention will be described below.

Figure 16:
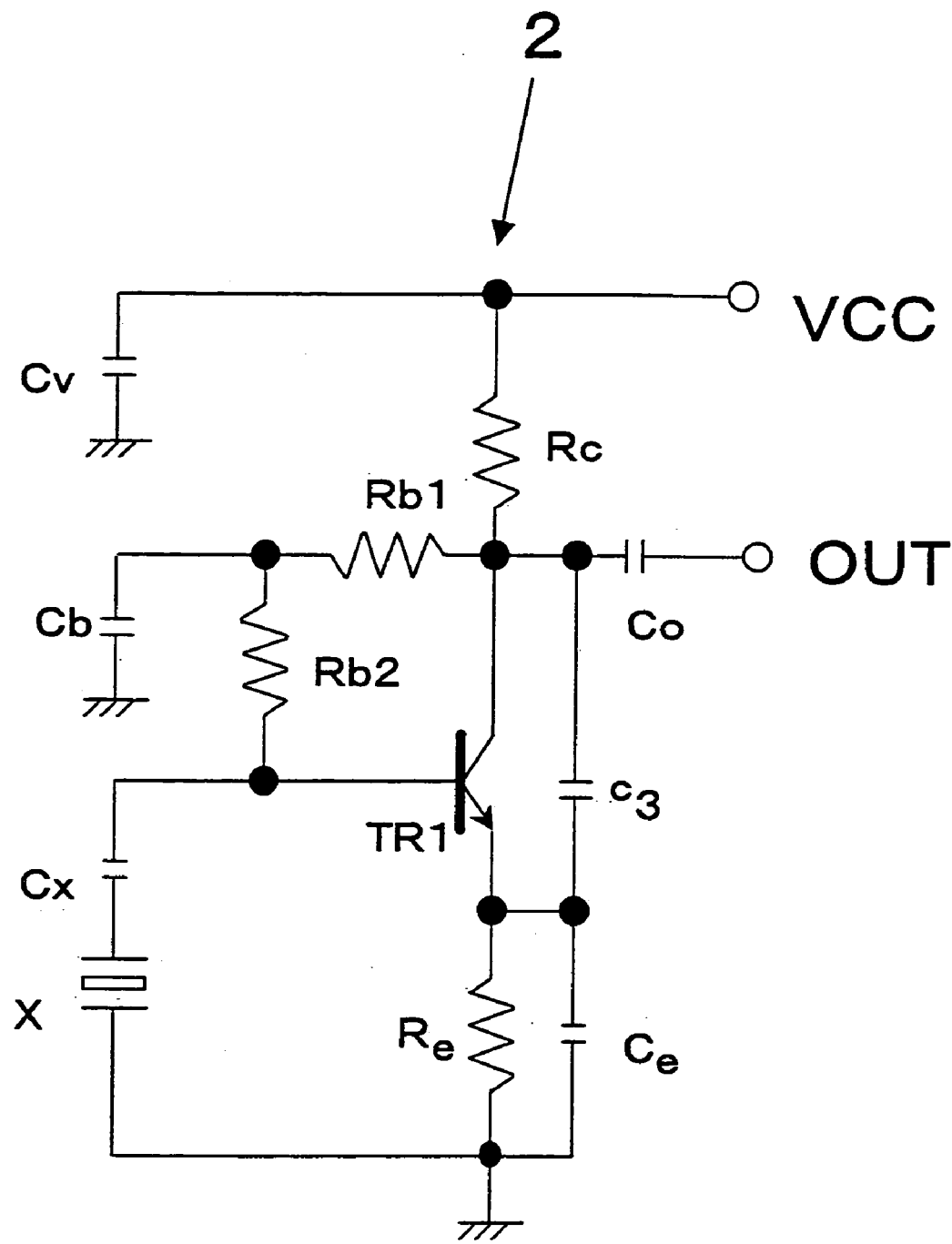
FIG. 16 is a circuit diagram depicting another embodiment of the piezoelectric oscillator according to the present invention.

FIG. 16 is a circuit diagram illustrating another embodiment of the piezoelectric oscillator according to the present invention, which uses a crystal vibrator as the piezoelectric vibrator.

In a piezoelectric oscillation circuit 2 depicted in FIG. 16, the base of the oscillation transistor TR1 is grounded via a series circuit of a capacitance Cx and a crystal vibrator X, and a parallel circuit of the capacitance $C_e$ forming part of the load capacitance and the emitter resistance $R_e$ is connected between the emitter of the transistor and the ground. Further, the resistance Rc is connected as a collector load resistance between the power supply (Vcc) grounded AC-wise via a capacitance Cv and the collector of the transistor, the capacitance $C_3$ forming part of the load capacitance is connected between the collector and emitter of the transistor, and a series circuit of resistances Rb1 and Rb2 (a base bias circuit) is connected between the base and collector of the transistor to apply a base bias voltage through the series circuit. Incidentally, a bypass capacitor Cb is connected between the connection midpoint of the bias resistance series circuit and the ground; this is to prevent feedback of the AC output from the collector of the oscillation transistor to the base thereof, ensuring application of a DC bias alone.

Figure 17:
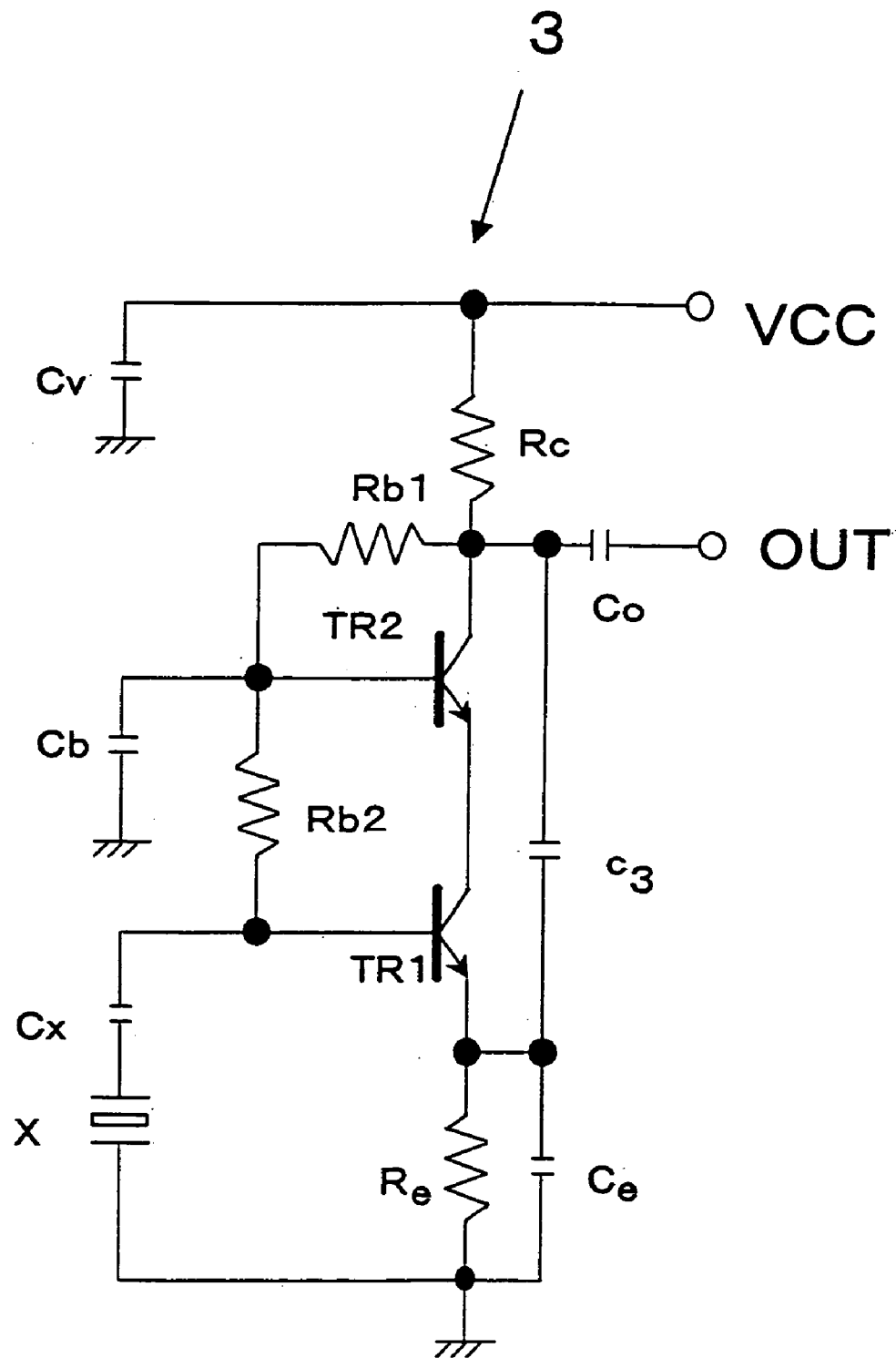
FIG. 17 is a circuit diagram depicting another embodiment of the piezoelectric oscillator according to the present invention.

FIG. 17 is a circuit diagram illustrating another embodiment of the present invention.

In this embodiment a transistor TR2 is cascade-connected as a buffer amplifier to the FIG. 16 circuit, the base of the transistor is grounded AC-wise via the bias capacitance Cb (to form a common base transistor amplifier), and the oscillation output is derived from the collector of the buffer amplification transistor TR2. That is, in the FIG. 16 circuit a situation may sometimes arise where NFB (negative feedback) by the mirror effect between the collector and emitter of the oscillation transistor TR1 lowers the oscillation gain and affects the output load. The cascade connection of the buffer transistor TR2 is intended to avoid this.

Incidentally, the base bias scheme in FIGS. 16 and 17 is a voltage feedback auto-bias scheme, according to which when the collector current changes due to a temperature change, a power supply change or the like, the potential at the connection point (collector) of the transistor TR2 to the resistance Rc varies to change currents to be supplied to the bases of the transistors TR2 and TR1 (via the resistances Rb1 and Rb2, respectively), thereby effecting self-control to provide appropriate current values at all times.

Figure 18:
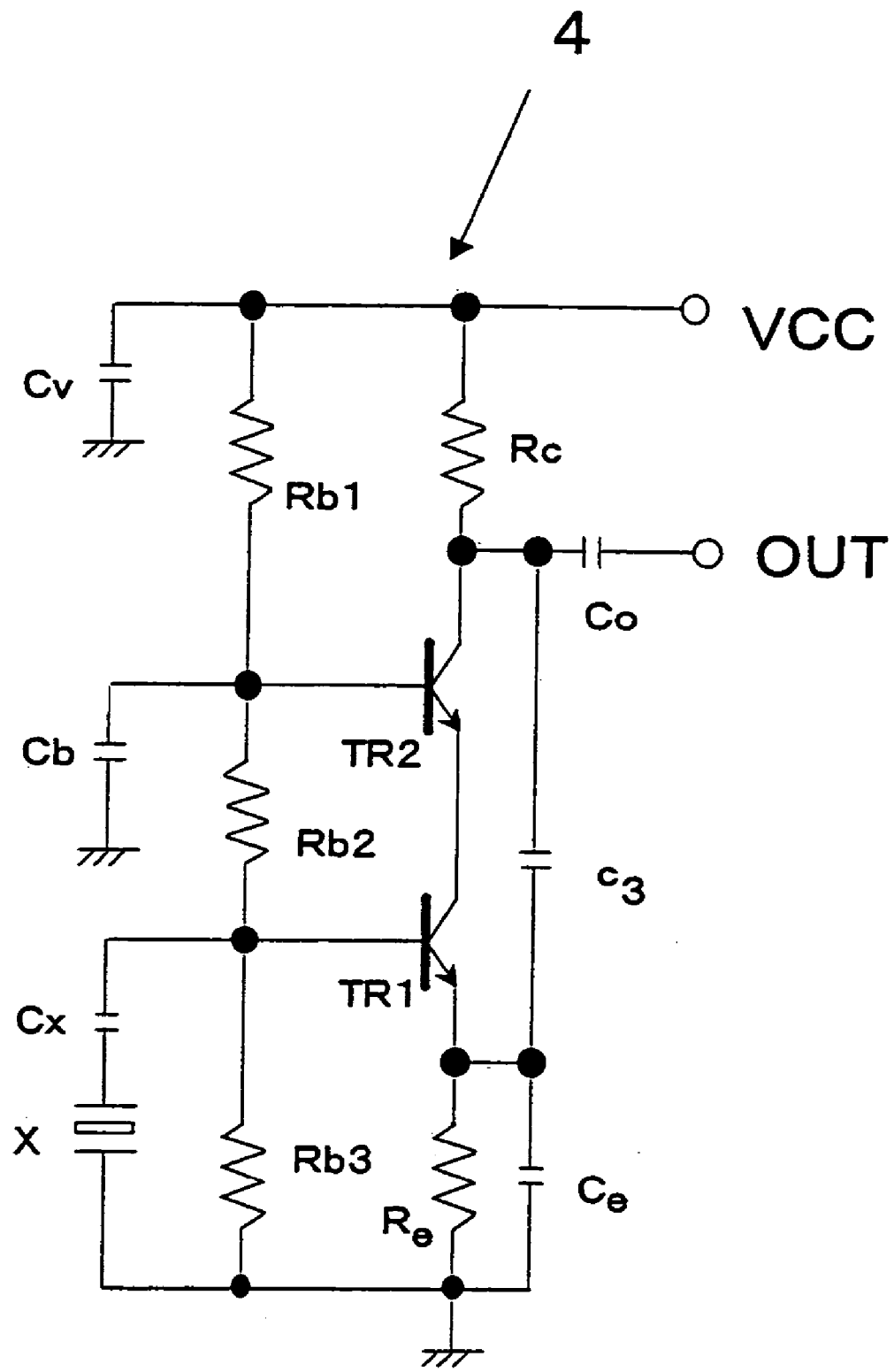
FIG. 18 is a circuit diagram depicting another embodiment of the piezoelectric oscillator according to the present invention.

FIG. 18 is a circuit diagram illustrating another embodiment of the crystal oscillator according to the present invention.

The illustrated crystal oscillator 4 differs from the above-described crystal oscillator in that the base bias scheme used is a current feedback auto-bias scheme, according to which a change in the collector-to-emitter current, for example, an increase in the emitter-terminal current increases in the terminal voltage of the emitter resistance $R_e$, thereby automatically reducing the base-to-emitter current to stabilize the bias point.

Figure 19:
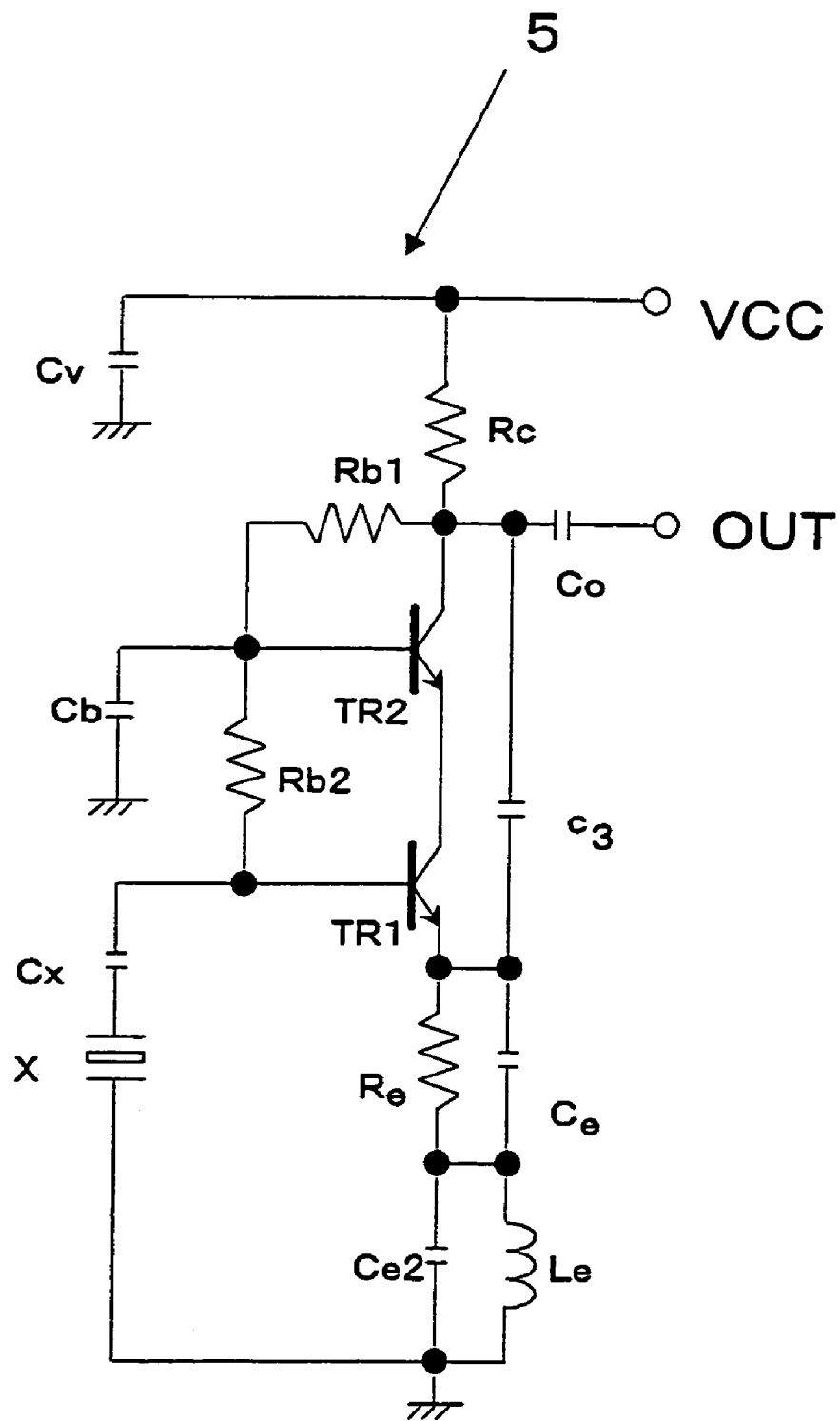
FIG. 19 is a circuit diagram depicting another embodiment of the piezoelectric oscillator according to the present invention.

FIG. 19 is a circuit diagram illustrating another embodiment of the crystal oscillator according to the present invention.

The illustrated crystal oscillation circuit 5 differs from the above crystal oscillation circuit in that a parallel tuning circuit of an inductance Le and a capacitance Ce2 is connected to the emitter side of the oscillation transistor TR1. In this case, however, the capacitance $C_e$ functions as a bypass capacitance. In this embodiment, the insertion of the LC tuning circuit increases the oscillation gain (negative resistance) and imparts thereto a frequency characteristic, thereby permitting an overtone oscillation (higher harmonic oscillation).

Incidentally, the insertion of the parallel tuning circuit in the circuit of FIG. 19 is applicable to the circuits of FIGS. 1 and 16 as well.

That is, in the circuits of the present invention shown in FIGS. 1 and 16 the connection of the LC parallel tuning circuit to the emitter side of the transistor TR1 increases the oscillation gain (negative resistance) and imparts thereto a frequency characteristic, thereby permitting an overtone oscillation (higher harmonic oscillation).

Figure 20:
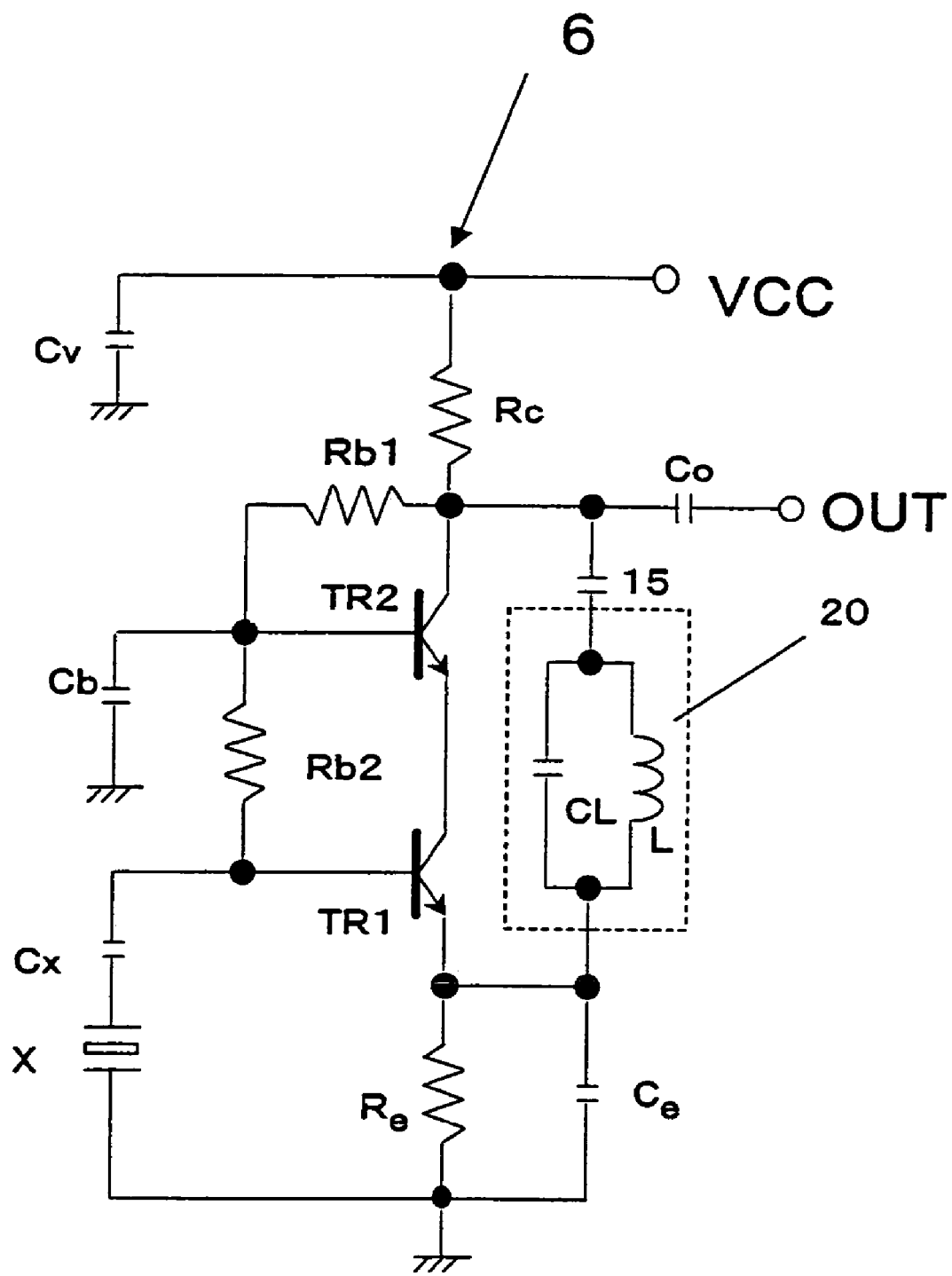
FIG. 20 is a circuit diagram depicting another embodiment of the piezoelectric oscillator according to the present invention.

FIG. 20 is a circuit diagram illustrating still another embodiment of the crystal oscillator according to the present invention.

A feature of the illustrated crystal oscillator 6 resides in that a parallel tuning circuit 20 composed of an inductance L and a capacitance CL is connected, as a substitute for the capacitance $c_3$, between the collector of the transistor TR1 and the emitter of the transistor TR2, the tuning frequency being set slightly higher than the oscillation frequency (so that the parallel circuit becomes capacitive).

Figure 21:
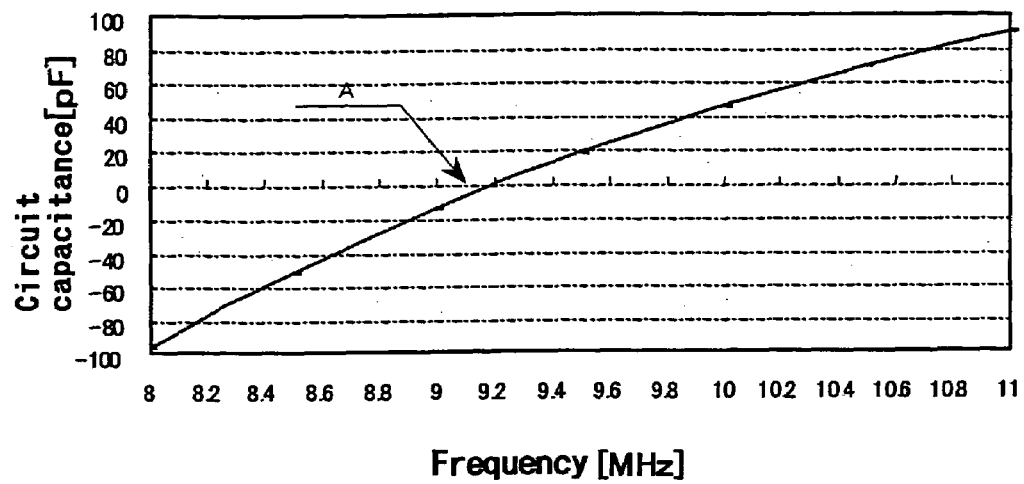
FIG. 21 is a graph showing a circuit capacity-frequency characteristic of the crystal oscillator depicted in FIG. 20.
Figure 22:
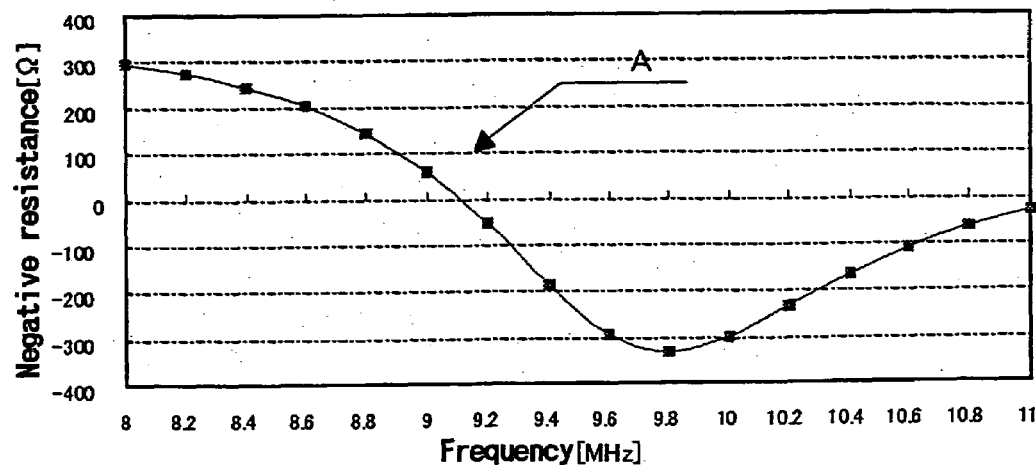
FIG. 22 is a graph showing a negative resistance-frequency characteristic of the crystal oscillator depicted in FIG. 20.

For example, by setting the capacitance CL at 300 pF, the inductance L at 1 µH and resonance frequency at about 9.2 MHz when the oscillation frequency is 10 MHz, the impedance characteristic of the tuning circuit 20 becomes such as indicated by the solid line A in FIG. 21. At frequencies lower than the resonance frequency, the tuning circuit becomes inductive and at higher tuning frequencies the circuit becomes capacitive, allowing the oscillation circuit to oscillate. The oscillation circuit does not oscillate at frequencies lower than the resonance frequency, but at higher frequencies the feedback capacitance increases, causing a decrease in the oscillation gain. In FIG. 22 there is shown the oscillation gain (negative resistance) characteristic of the oscillation circuit having incorporated therein such a tuning circuit.

As is apparent from FIG. 22, the frequency band over which oscillation is possible is as narrow as about 9 to 11 MHz—this suggests that the invention is also applicable, for example, to a B-mode suppression circuit of a high-stability oscillator using an SC-Cut vibrator which is required to oscillate within a particularly narrow frequency band.

Incidentally, the characteristic shown in FIG. 22 was measured by means of an impedance meter connected across the oscillation circuit 6 of FIG. 20, with the vibrator X removed therefrom, under such conditions as follows: power supply voltage Vcc=5V, capacitance Cx=20 pF, capacitance $C_e$=430 pF, capacitance CL=300 pF, capacitances Cb, Cv and Cs=0.1 µF, capacitance Co=20 pF, inductance L=1 µH, resistance $R_e$=330Ω, resistance Rb1 and Rb2=10 kΩ, and resistance Rc=560Ω.

In the circuits of FIGS. 1 and 16, too, the substitution of the capacitance $c_3$ with the parallel tuning circuit composed of the inductance L and the capacitance CL produces the same effects as described above.

While the present invention has been described above as being applied to the oscillator using the crystal vibrator, the invention is not limited specifically thereto but is applicable as well to piezoelectric oscillators using a SAW resonator, a ceramic vibrator and a piezoelectric vibrator formed principally of a piezoelectric crystalline material.

Furthermore, the above description has been given primarily on the assumption that the transistor used is of the NPN type, but it is a matter of course that PNP type transistors could also be similarly configured to produce the same effects as described above.

What is claimed is:

1. A piezoelectric oscillator comprising a piezoelectric vibrator functioning as a resonance inductance and an oscillation transistor, characterized in that: only a collector load resistance is connected between the collector of said oscillation transistor and an AC-wise grounded power supply; a first capacitance is connected between an emitter and collector of said oscillation transistor, a parallel circuit of a resistance and a second capacitance is connected between the emitter of said oscillation transistor and ground, and at least said piezoelectric vibrator is connected between a base of said oscillation transistor and the ground; and said first capacitance has a value 0.1 times larger than that of said second capacitance.

2. A piezoelectric oscillator comprising a piezoelectric vibrator functioning as a resonance inductance and an oscillation transistor, characterized in that: a collector load resistance is connected between the collector of said transistor and an AC-wise grounded power supply, a first capacitance is connected between an emitter and collector of said oscillation transistor, a parallel circuit of a resistance and a second capacitance is connected between the emitter of said oscillation transistor and ground, and at least said piezoelectric vibrator is connected between a base of said transistor and the ground, respectively; and said first capacitance has a value larger than that of said second capacitance.

3. A piezoelectric oscillator comprising a piezoelectric vibrator functioning as a resonance inductance and an oscillation transistor, characterized in that: a collector load resistance is connected between the collector of said oscillation transistor and an AC-wise grounded power supply, a first capacitance is connected between an emitter and collector of said transistor, a parallel circuit of a resistance and a second capacitance is connected between the emitter of said transistor and ground, and at least said piezoelectric vibrator is connected between a base of said oscillation transistor and the ground, respectively; and said first capacitance has a value in the range of larger than 1 to smaller than 3 times the value of said second capacitance.

4. A piezoelectric oscillator comprising a piezoelectric vibrator functioning as a resonance inductance, an oscillation transistor, and buffer transistor, characterized in that: a collector of said oscillation transistor and an emitter of said buffer transistor are cascade-connected in the forward direction; an appropriate bias voltage is applied to each base of said oscillation and buffer transistors; the base of said buffer transistor is grounded AC-wise via a bypass capacitance; only a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance; at least said piezoelectric vibrator is connected between the base of said transistor and ground; and said first capacitance has a value 0.1 times larger than that of said second capacitance.

5. A piezoelectric oscillator comprising a piezoelectric vibrator functioning as a resonance inductance, an oscillation transistor, and buffer transistor, characterized in that: a collector of said oscillation transistor and an emitter of said buffer transistor are cascade-connected in the forward direction; an appropriate bias voltage is applied to each base of said oscillation and buffer transistors; the base of said buffer transistor is grounded AC-wise via a bypass capacitance; a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance; at least said piezoelectric vibrator is connected between the base of said transistor and ground; and said first capacitance has a value larger than that of said second capacitance.

6. A piezoelectric oscillator comprising a piezoelectric vibrator functioning as a resonance inductance, an oscillation transistor, and buffer transistor, characterized in that: a collector of said oscillation transistor and an emitter of said buffer transistor are cascade-connected in the forward direction; an appropriate bias voltage is applied to each base of said oscillation and buffer transistors; the base of said buffer transistor is grounded AC-wise via a bypass capacitance; a collector load resistance is connected between the collector of said buffer transistor and an AC-wise grounded power supply; a first capacitance is connected between the collector of said buffer transistor and the emitter of said oscillation transistor; the emitter of said oscillation transistor is grounded via a parallel circuit of a resistance and a second capacitance; at least said piezoelectric vibrator is connected between the base of said transistor and ground; and said first capacitance has a value in the range of larger than 1 to smaller than 3 times the value of said second capacitance.

7. A piezoelectric oscillator comprising a piezoelectric vibrator functioning as a resonance inductance and an oscillation transistor, characterized in that: only a collector load resistance is connected between the collector of said oscillation transistor and an AC-wise grounded power supply; a first capacitance is connected between an emitter and collector of said oscillation transistor, a parallel circuit of a resistance and a second capacitance is connected between the emitter of said oscillation transistor and ground, and at least said piezoelectric vibrator is connected between the base of said transistor and the ground, respectively; a series circuit of two resistances is connected between the collector and base of said oscillation transistor, the connection point of said two resistances being grounded AC-wise via a bypass capacitance; and said first capacitance has a value 0.1 times larger than that of said second capacitance.

8. A piezoelectric oscillator comprising a piezoelectric vibrator functioning as a resonance inductance and an oscillation transistor, characterized in that: a collector load resistance is connected between the collector of said oscillation transistor and an AC-wise grounded power supply, a first capacitance is connected between an emitter and collector of said oscillation transistor, a parallel circuit of a resistance and a second capacitance is connected between the emitter of said oscillation transistor and the ground, and at least said piezoelectric vibrator is connected between a base of said transistor and the ground, respectively; a series circuit of two resistances is connected between the collector and base of said oscillation transistor, the connection point of said two resistances being grounded AC-wise via a bypass capacitance; and said first capacitance has a value larger than that of said second capacitance.

9. A piezoelectric oscillator comprising a piezoelectric vibrator functioning as a resonance inductance and an oscillation transistor, characterized in that: a collector load resistance is connected between the collector of said oscillation transistor and an AC-wise grounded power supply, a first capacitance is connected between emitter and collector of said transistor, a parallel circuit of a resistance and a second capacitance is connected between the emitter of said oscillation transistor and the ground, and at least said piezoelectric vibrator is connected between base of said oscillation transistor and the ground, respectively; a series circuit of two resistances is connected between the collector and base of said oscillation transistor, the connection point of said two resistances being grounded AC-wise via a bypass capacitance; and said first capacitance has a value in the range of larger than 1 to smaller than 3 times the value of said second capacitance.

10. A piezoelectric oscillator comprising a piezoelectric vibrator functioning as a resonance inductance, an oscillation transistor, and buffer transistor, characterized in that: a collector of said oscillation transistor and an emitter of said buffer transistor are cascade-connected in the forward direction; an appropriate bias voltage is applied to each base of said oscillation and buffer transistors; the base of said buffer transistor is grounded AC-wise via a bypass capacitance; only a collector load resistance is connected between a collector of said buffer transistor and an AC-wise grounded power supply; a first capacitance is connected between the collector of said buffer transistor and the emitter of said oscillation transistor; an emitter of said oscillation transistor is grounded via a parallel circuit of a resistance and a second capacitance and a parallel circuit of a third capacitance and an inductance; at least said piezoelectric vibrator is connected between the base of said transistor and ground; and said first capacitance has a value 0.1 times larger than that of said second capacitance.

11. A piezoelectric oscillator comprising a piezoelectric vibrator functioning as a resonance inductance, an oscillation transistor, and buffer transistor, characterized in that: a collector of said oscillation transistor and an emitter of said buffer transistor are cascade-connected in the forward direction; an appropriate bias voltage is applied to each base of said oscillation and buffer transistors; the base of said buffer transistor is grounded AC-wise via a bypass capacitance; a collector load resistance is connected between a collector of said buffer transistor and an AC-wise grounded power supply; a first capacitance is connected between the collector of said buffer transistor and an emitter of said oscillation transistor; the emitter of said oscillation transistor is grounded via a parallel circuit of a resistance and a second capacitance and a parallel circuit of a third capacitance and an inductance; at least said piezoelectric vibrator is connected between the base of said oscillation transistor and ground; and said first capacitance has a value larger than that of said second capacitance.

12. A piezoelectric oscillator comprising a piezoelectric vibrator functioning as a resonance inductance, an oscillation transistor, and buffer transistor, characterized in that: a collector of said oscillation transistor and an emitter of said buffer transistor are cascade-connected in the forward direction; an appropriate bias voltage is applied to each base of said oscillation and buffer transistors; the base of said buffer transistor is grounded AC-wise via a bypass capacitance; a collector load resistance is connected between a collector of said buffer transistor and an AC-wise grounded power supply; a first capacitance is connected between the collector of said buffer transistor and an emitter of said oscillation transistor; the emitter of said oscillation transistor is grounded via a parallel circuit of a resistance and a second capacitance and a parallel circuit of a third capacitance and an inductance; at least said piezoelectric vibrator is connected between the base of said oscillation transistor and ground; and said first capacitance has a value in the range of larger than 1 to smaller than 3 times the value of said second capacitance.

13. A piezoelectric oscillator comprising a piezoelectric vibrator functioning as a resonance inductance and an oscillation transistor, characterized in that: only a collector load resistance is connected between the collector of said transistor and an AC-wise grounded power supply; a first capacitance is connected between an emitter and collector of said oscillation transistor, and at least said piezoelectric vibrator is connected between a base of said oscillation transistor and the ground, respectively; the emitter of said oscillation transistor is grounded via a parallel circuit of a resistance and a second capacitance and a parallel circuit of a third capacitance and an inductance; and said first capacitance has a value 0.1 times larger than that of said second capacitance.

14. A piezoelectric oscillator comprising a piezoelectric vibrator functioning as a resonance inductance and an oscillation transistor, characterized in that: a collector load resistance is connected between the collector of said oscillation transistor and an AC-wise grounded power supply, a first capacitance is connected between an emitter and collector of said oscillation transistor, and at least said piezoelectric vibrator is connected between base of said oscillation transistor and ground, respectively; the emitter of said oscillation transistor is grounded via a parallel circuit of a resistance and a second capacitance and a parallel circuit of a third capacitance and an inductance; and said first capacitance has a value larger than that of said second capacitance.

15. A piezoelectric oscillator comprising a piezoelectric vibrator functioning as a resonance inductance and an oscillation transistor, characterized in that: a collector load resistance is connected between the collector of said oscillation transistor and an AC-wise grounded power supply, a first capacitance is connected between an emitter and collector of said oscillation transistor, and at least said piezoelectric vibrator is connected between base of said oscillation transistor and ground, respectively; the emitter of said oscillation transistor is grounded via a parallel circuit of a resistance and a second capacitance and a parallel circuit of a third capacitance and an inductance; and said first capacitance has a value in the range of larger than 1 to smaller than 3 times the value of said second capacitance.

16. A piezoelectric oscillator comprising a piezoelectric vibrator functioning as a resonance inductance, an oscillation transistor, and buffer transistor, characterized in that: the collector of said oscillation transistor and an emitter of said buffer transistor are cascade-connected in the forward direction; an appropriate bias voltage is applied to each base of said oscillation and buffer transistors; the base of said buffer transistor is grounded AC-wise via a bypass capacitance; a collector load resistance is connected between a collector of said buffer transistor and an AC-wise grounded power supply; a circuit having a DC cut-off capacitance connected in series to a parallel circuit of a first capacitance and an inductance is connected between the collector of said buffer transistor and an emitter of said oscillation transistor; the emitter of said oscillation transistor is grounded via a parallel circuit of a resistance and a second capacitance; and at least said piezoelectric vibrator is connected between the base of said oscillation transistor and the ground.

17. A piezoelectric oscillator comprising a piezoelectric vibrator functioning as a resonance inductance and an oscillation transistor, characterized in that: a collector load resistance is connected between the collector of said oscillation transistor and an AC-wise grounded power supply, a capaci tance is connected between an emitter and collector of said oscillation transistor, a parallel circuit of a resistance and a capacitance is connected between the emitter of said oscillation transistor and ground, and at least said piezoelectric vibrator is connected between the base of said transistor and the ground, respectively; and a circuit having a DC cut-off capacitance connected in series to a parallel circuit of a capacitance and an inductance is connected.

* * * * *